United States Patent
Arora et al.

(10) Patent No.: US 11,824,539 B2
(45) Date of Patent: Nov. 21, 2023

(54) CLOCK MULTIPLEXER CIRCUITRY WITH GLITCH REDUCTION

(71) Applicant: Synopsys, Inc., Mountain View, CA (US)

(72) Inventors: Hardik Arora, Bastar (IN); Amit Verma, Naraingarth (IN); Basannagouda Somanath Reddy, Ontario (CA)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/885,386

(22) Filed: Aug. 10, 2022

(65) Prior Publication Data

US 2023/0051554 A1 Feb. 16, 2023

Related U.S. Application Data

(60) Provisional application No. 63/231,955, filed on Aug. 11, 2021.

(51) Int. Cl.
*H03K 3/00* (2006.01)
*H03K 3/037* (2006.01)
*G06F 1/10* (2006.01)
*H03K 19/20* (2006.01)
*H03K 21/10* (2006.01)

(52) U.S. Cl.
CPC .............. *H03K 3/037* (2013.01); *G06F 1/10* (2013.01); *H03K 19/20* (2013.01); *H03K 21/10* (2013.01)

(58) Field of Classification Search
CPC ........ H03K 3/037; H03K 19/20; H03K 21/10; H03K 5/135; G06F 1/10
USPC .......................................................... 327/199
See application file for complete search history.

(56) References Cited

U.S. PATENT DOCUMENTS

| | | | |
|---|---|---|---|
| 9,797,949 B2* | 10/2017 | Oshiyama | G01R 31/31727 |
| 10,860,126 B2* | 12/2020 | Lee | G06F 3/0443 |
| 11,056,976 B2* | 7/2021 | Lu | H02M 3/1588 |
| 11,163,328 B1* | 11/2021 | Bae | H03L 7/00 |
| 2016/0219662 A1* | 7/2016 | Ho | H05B 45/3725 |
| 2023/0051554 A1* | 2/2023 | Arora | G06F 1/10 |

* cited by examiner

*Primary Examiner* — Ryan Jager
(74) *Attorney, Agent, or Firm* — Patterson + Sheridan, LLP

(57) ABSTRACT

Clock multiplexer circuitry outputs one of a first or second clock signal. First selection circuitry is connected in series with first counter circuitry. The first selection circuitry and the first counter circuitry receive a first clock signal and a first selection signal. A first control signal is generated based on the first clock signal and the first selection signal. Second selection circuitry is connected in series with second counter circuitry. The second selection circuitry and the second counter circuitry receive a second clock signal and a second selection signal. A second control signal is generated based on the second clock signal and the second selection signal. The output circuitry is connected to the first counter circuitry and the second counter circuitry. The output circuitry outputs one of the first clock signal and the second clock signal based on the first control signal and the second control signal.

20 Claims, 12 Drawing Sheets

CLOCK MULTIPLEXER CIRCUITRY WITH GLITCH REDUCTION

RELATED APPLICATION

This application claims the benefit of U.S. provisional patent application Ser. No. 63/231,955, filed Aug. 11, 2021, which is hereby incorporated herein by reference.

TECHNICAL FIELD

The present disclosure generally relates to clock multiplexer circuitry, and, more specifically, to clock multiplexer circuitry that generates a clock signal with reduced glitches.

BACKGROUND

In the design of an application specific integrated circuit (ASIC), an increasing number of circuit blocks are being integrated within an integrated circuit (IC). The circuit blocks may use multiple clock sources that operate at different clock frequencies. In one implementation, multiplexer circuitry is used to select among multiple clock signals based on a logic state of a select line. In various implementations, two or more of the different clock signals may be related. For example, two or more of clock signals have a common phase or a common frequency. In other implementations, the clocks signals are unrelated. In such implementations, the multiplexer circuitry may introduce glitches (e.g., errors) in the output when switching between the different clock signals. As the output of multiplexer circuit is a clock signal, any glitch (or error) may be misinterpreted as a clock edge. Accordingly, circuit elements receiving the output of the multiplexer circuitry may be incorrectly enabled or fail to become enabled.

SUMMARY

In one example, clock multiplexer circuitry includes first selection circuitry, second selection circuitry, and output circuitry. The first selection circuitry is connected in series with first counter circuitry. The first selection circuitry and the first counter circuitry receive a first clock signal and a first selection signal. A first control signal is generated based on the first clock signal and the first selection signal. The second selection circuitry is connected in series with second counter circuitry. The second selection circuitry and the second counter circuitry receive a second clock signal and a second selection signal. A second control signal is generated based on the second clock signal and the second selection signal. The output circuitry is connected to the first counter circuitry and the second counter circuitry. The output circuitry outputs one of the first clock signal and the second clock signal based on the first control signal and the second control signal.

In one example, clock multiplexer circuitry includes first selection circuitry, first counter circuitry, second selection circuitry, second counter circuitry, and output circuitry. The first selection circuitry receives a first clock signal, a first selection signal, and a first control signal, and outputs a first selected signal based on the first control signal. The first selected signal is one of the first clock signal and the first selection signal. The first counter circuitry receives the first selected signal and the first selection signal, and outputs a first counter signal and a second counter signal based on the first selected signal and the first selection signal. The second selection circuitry receives a second clock signal, a second selection signal, and a second control signal, and outputs a second selected signal based on the second control signal. The second selected signal is one of the second clock signal and the second selection signal. The second counter circuitry receives the first selected signal and the first selection signal, and outputs a third counter signal and a fourth counter signal based on the first selected signal and the second selection signal. The output circuitry connected to the first counter circuitry and the second counter circuitry output one of the first clock signal and the second clock signal based on the first counter signal, the second counter signal, the third counter signal, and the fourth counter signal.

In one example, a method includes outputting, via first selection circuitry of clock multiplexer circuitry, a first selected signal based on a first control signal. The first selected signal is one of a first clock signal and a first selection signal. The method further includes outputting, via first counter circuitry of the clock multiplexer circuitry, a first counter signal based on the first selected signal and the first selection signal, and a second counter signal based on the first counter signal and the first selection signal. Further, the method includes outputting, via second selection circuitry of the clock multiplexer circuitry, a second selected signal based on a second control signal. The first selected signal is one of a second clock signal and a second selection signal. The method further includes outputting, via second counter circuitry of the clock multiplexer circuitry, a third counter signal based on the second selected signal and the second selection signal, and a fourth counter signal based on the third counter signal and the second selection signal. Further, the method includes outputting, via output circuitry of the clock multiplexer circuitry, one of the first clock signal and the second clock signal based on the first counter signal, the second counter signal, the third counter signal, and the fourth counter signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to clock multiplexer circuitry that outputs a clock signal with reduced errors.

Electronic devices include multiple clock signals that propagate to different parts of the electronic devices with control signals. The control signals are used to control which clock signal is provided to each part of an electronic device at different times. In various instances, clock multiplexer circuitry is included within the electronic devices and used to control the selection of the clock signals. The clock multiplexer circuitry receives multiple clock signals and selects one of the clock signals to output based on one or a ore controls signals. However, errors may occur in the output (e.g., the output clock signal) when switching between the different clock signals. The errors may be referred to as glitches. In some instances, the errors may include erroneous pulses that are included within the output clock signal. Accordingly, errors may occur within the circuit elements receiving the clock signal, causing errors within the larger electronic device.

The clock multiplexer circuitry describes herein generates an error (e.g., glitch) free output (e.g., output clock signal). The clock multiplexer circuitry described herein includes multiple paths, each having a multiplexer circuit, counter circuitry, and output logic to generate an output (e.g., a clock signal) that is substantially free from errors. An output that is substantially free from errors is a signal (e.g., clock signal) that may have one or more variations from an ideal signal (e.g., an ideal clock signal) but does not induce errors in the corresponding system (e.g., electronic device). The clock multiplexer circuitry described herein mitigates errors that may occur when transitioning between clock signals. In one example, sampling techniques are used to sample a first clock signal after de-selecting a second clock signal, mitigating errors in the output signal.

The technical advantages of the present disclosure include, but are not limited to mitigating errors within circuit elements of an electronic device by mitigating errors in the output clock signals generated by a clock multiplexer circuitry. Accordingly, the performance of the electronic device is improved as compared to electronic systems that employ other clock multiplexer circuitries. Further, the clock multiplexer circuitry described herein uses less circuit area than that of other clock multiplexer circuitries, reducing the semiconductor manufacturing costs of the corresponding electronic devices.

Figure 1:
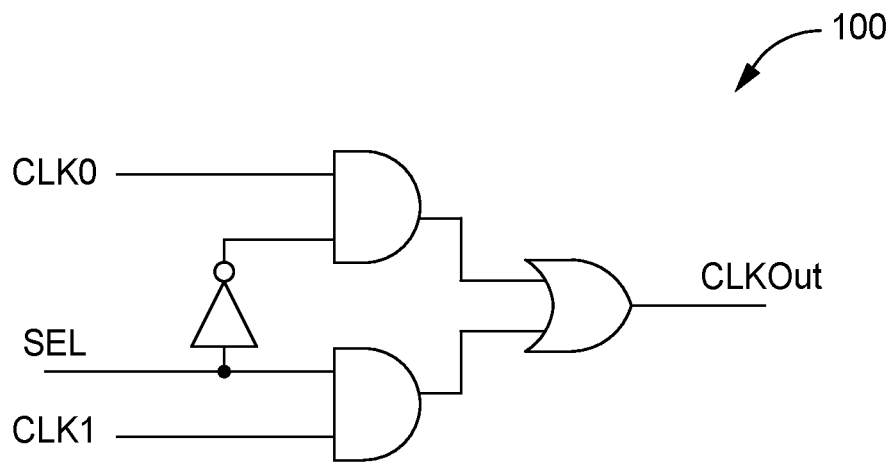
FIG. 1 illustrates a schematic block diagram of example clock multiplexer circuitry.
Figure 2:
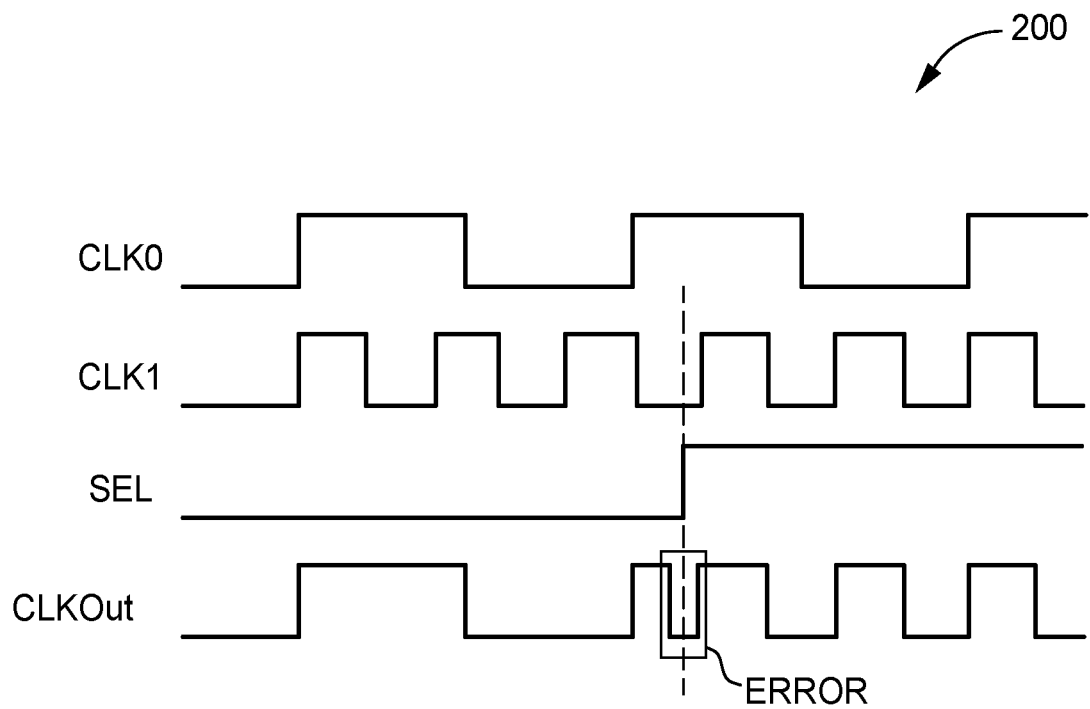
FIG. 2 illustrates example signals of the clock multiplexer circuitry shown in FIG. 1.

FIG. 1 illustrates an example clock multiplexer circuitry 100 that generates a clock signal (e.g., the output clock signal $CLKOut_1$) having one or more errors. The clock multiplexer circuitry 100 includes AND-OR combinational logic gates. The multiplexer circuitry 100 receives clock signal inputs CLK0 and CLK1, and select signal SEL, and outputs the clock signal $CLKOut_1$. The multiplexer circuitry 100 outputs the clock signal CLK0 as the output clock signal $CLKOut_1$ or the clock signal CLK1 as the output clock signal $CLKOut_1$ based on a state of the select signal SEL. The select signal SEL transitions between a logic value of 0 (e.g., a low voltage value) and a logic value of 1 (e.g., a high voltage value). The multiplexer circuitry 100 outputs the clock signal CLK0 as the output clock signal $CLKOut_1$ when the select signal SEL has a logic value of 0. The multiplexer circuitry 100 outputs the clock signal CLK1 as the output clock signal $CLKOut_1$ when the select signal has a logic value of 1. As the select signal SEL switches between logic values (e.g., logic value of 0 and a logic value of 1), errors are introduced in the output of the multiplexer circuitry 100. The errors further depend on a state of the clock signal CLK0 and the clock signal CLK1, as the selection signal SEL signal transitions (e.g., switches) between logic values of 0 and 1, as shown by FIG. 2. FIG. 2 illustrates a waveform diagram 200 of the clock signal CLK0, the clock signal CLK1, the select signal SEL, and the output clock signal $CLKOut_1$. As is illustrated in FIG. 2, when the selection signal transitions from a logic value of 0 to a logic value of 1, the clock signal CLK0 has a high voltage value and the clock signal CLK1 has a low voltage value, an error is introduced within the output clock signal $CLKOut_1$. As the error in the output is similar to a transition (e.g., clock pulse), errors are generated in the circuit elements that receive the output clock signal $CLKOut_1$.

Figure 3:
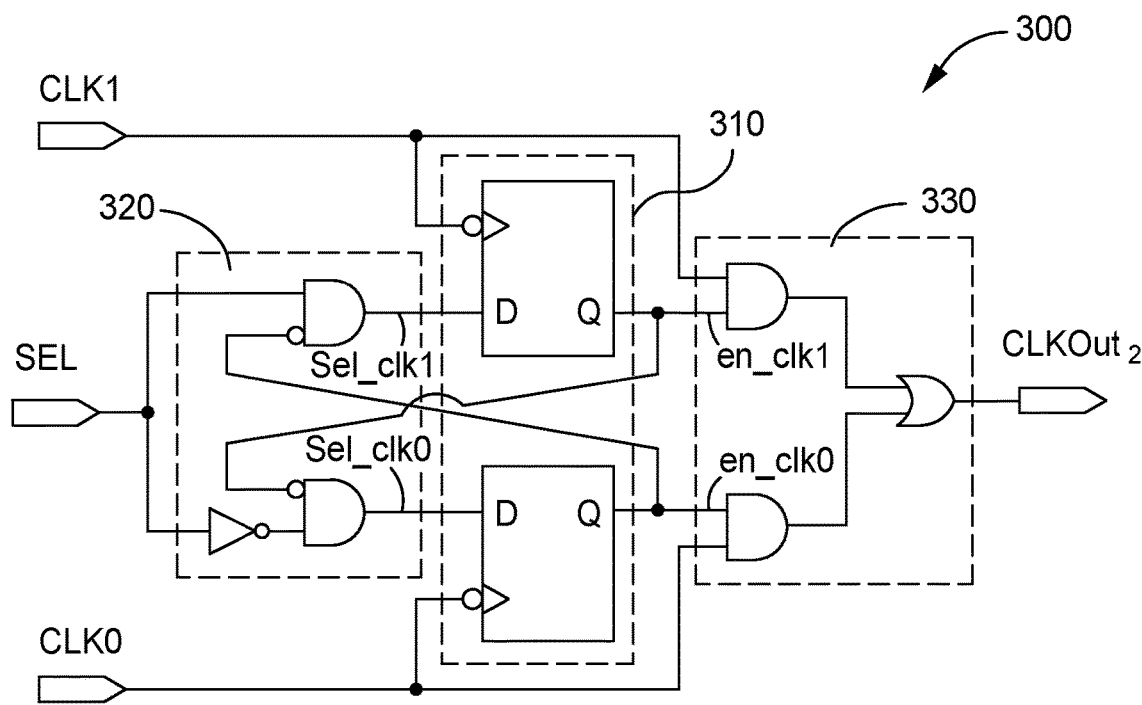
FIG. 3 illustrates a schematic block diagram of another example clock multiplexer circuitry.

FIG. 3 illustrates an example clock multiplexer circuitry 300 that generates a clock signal (e.g., the output clock signal $CLKOut_2$) having one or more errors. The clock multiplexer circuitry 300 includes negative edge triggered flip-flops 310 in the selection path for each clock signal CLK1 and CLK0. Further, the clock multiplexer circuitry 300 includes logic gates 320 and 330. The logic gates 320 include AND gates and an inverter. The logic gates 320 receive the select signal SEL. The logic gates 330 include AND gates and an OR gate. The logic gates 330 output the output clock signal $CLKOut_2$.

The negative edge triggered flip-flops 310 prevent the propagation of errors to be output within the output clock signal $CLKOut_2$. For example, the negative edge triggered flip-flops 310 control the selection of one of the clock signals CLK1 and CLK0 after selection of the other one of the clock signals CLK1 and CLK0 is de-asserted. The negative edge triggered flip-flop 310 registers the select signal at a negative edge of one of the clock signals to ensure that no changes (e.g., voltage transitions) occur at the output of the clock multiplexer circuitry 300, while either of the clock signals CLK0 and CLK1 is at high level. Accordingly, errors within output clock signal $CLKOut_2$ are mitigated. For example, the negative edge triggered flip-flops mitigate chopping of the output clock signal $CLKOut_2$. In one example, the feedback from the selection of one clock signal (e.g., the clock signal CLK0 or the clock signal CLK1) to the other enables the clock multiplexer circuitry 300 to wait for de-selection of the current clock signal before starting the propagation of the next clock signal. Accordingly, errors are mitigated in the output clock signal $CLKOut_2$.

Figure 4:
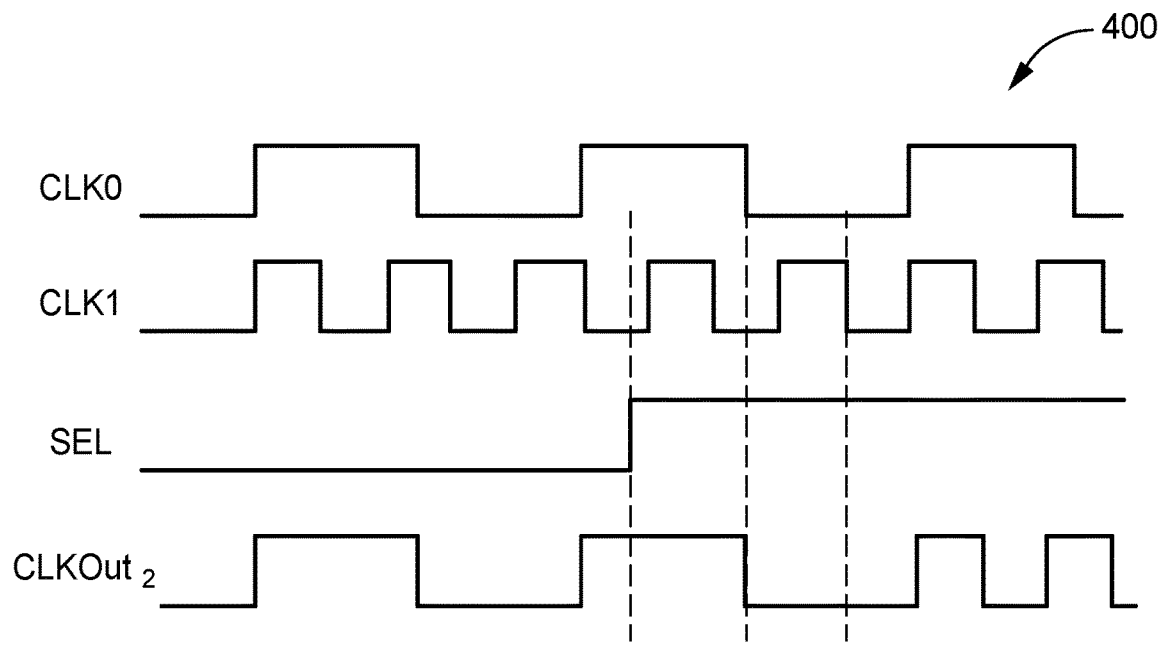
FIG. 4 illustrates example signals of the clock multiplexer circuitry shown in FIG. 3.

FIG. 4 illustrates a waveform diagram 400 of the clock signal CLK0, the clock signal CLK1, the selection signal SEL, and the output clock signal $CLKOut_2$ of FIG. 3. As is illustrated in FIG. 4, the transition of the select signal SEL from a logic value of 0 (e.g., low voltage value) to a logic value of 1 (e.g., high voltage value) stops propagation of the clock signal CLK0 to the output of the clock multiplexer circuit 300 as the output clock signal $CLKOut_2$ at the proceeding falling edge of the clock signal CLK0. The propagation of the clock signal CLK1 to the output of the clock multiplexer circuitry 300 as the output clock signal CLKOut$_2$ occurs at a following negative edge of the clock signal CLK1.

In the clock multiplexer circuitry 300, if any of the SEL control signal, and the output either one of the negative edge triggered flip-flops 310 change at the same time as the capturing edge of the destination flip flop's clock signal, the output of that flip-flop is in an unknown state, e.g., the output may go to a state between an ideal "one" and an ideal "zero". In the clock multiplexer circuitry 300, the clock signals CLK1 and CLK0 are multiples of each other. Accordingly, when the clock signals CLK1 and CLK0 are fully asynchronous to each other, a meta-stability may occur if the select signal SEL transitions near any active edge of the clock signals CLK1 and CLK0. In one example, the clock selection signals sel_clk0 and sel_clk1 are generated based on the selection signal SEL by the negative edge triggered flip-flops 310. The clock selection signals sel_clk0 and sel_clk1 are provided to the data input of a respective flipflop of the negative edge triggered flip-flops 310. A flipflop of the negative edge triggered flip-flops 310 may go into meta-stability based on the selection signal SEL signal having a transition near an edge of CLK0 or CLK1. Accordingly, the output clock signal CLKOut$_2$ may not properly reflect that state of the selected clock signal CLK0 and CLK1, and include one or more errors.

Figure 5:
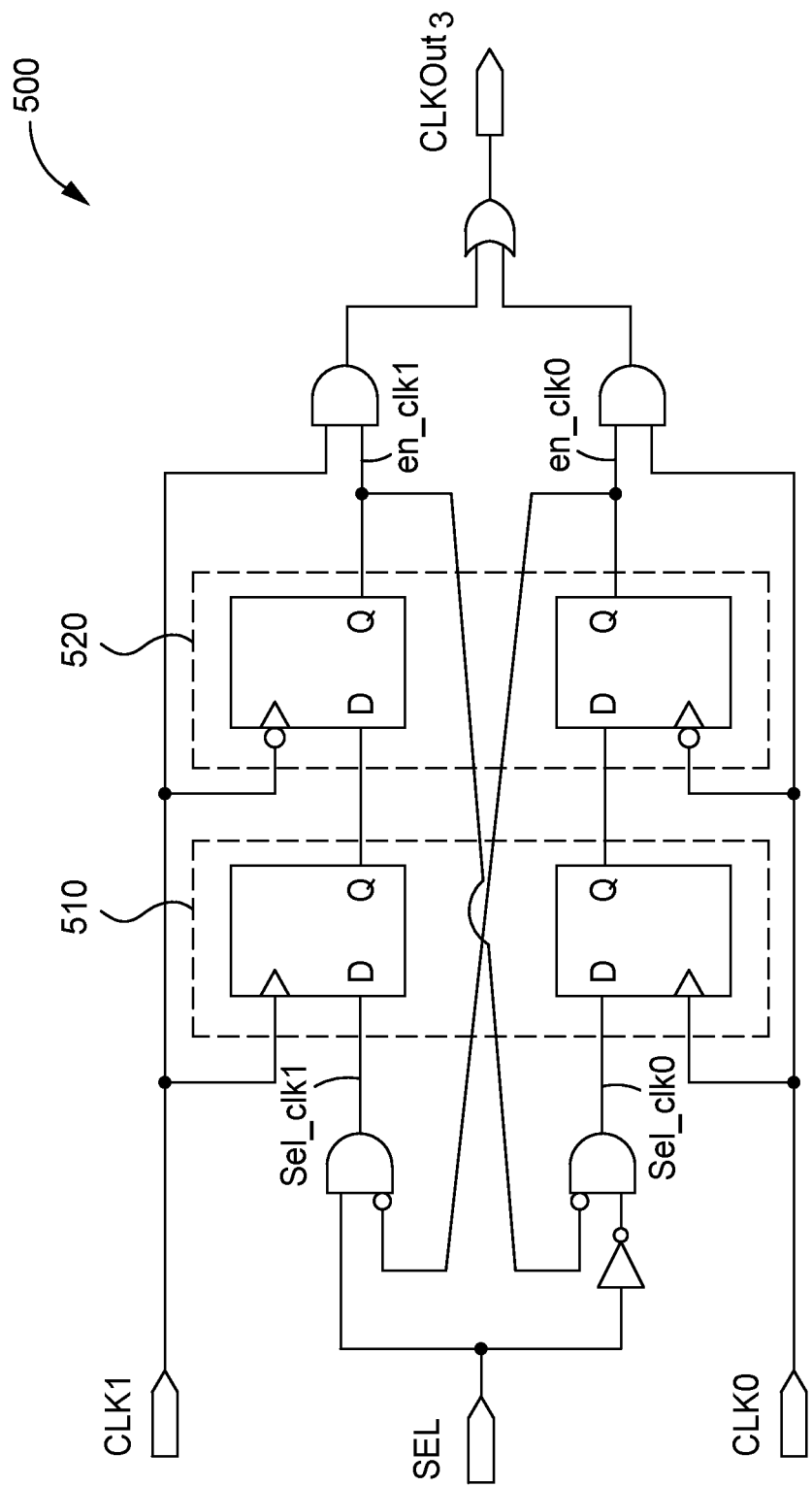
FIG. 5 illustrates a schematic block diagram of another example clock multiplexer circuitry.

FIG. 5 illustrates example clock multiplexer circuitry 500, according to one or more examples. As compared to the multiplexer circuitry 300, the clock multiplexer circuitry 500 prevents meta-stability in the output clock signal CLKOut$_3$ through the use of positive edge triggered flip-flops 510 and negative edge triggered flip-flops 520. The positive edge triggered flip-flops 510 receive the clock signals CLK0 and CLK1. The outputs of the positive edge triggered flip-flops 510 are coupled to the data inputs of the negative edge triggered flip-flops 520. The positive edge triggered flip-flops 510 and the negative edge triggered flip-flops 520, guards against potential meta-stability in the output clock signal CLKOut$_3$, which may be caused by an asynchronous selection signal SEL or asynchronous feedback from one path to the other. In one example, the positive edge triggered flip-flops 510 and the negative edge triggered flip-flops 520 form a synchronizer. The positive edge triggered flip-flops 510 are a first stage of the synchronizer, and the negative edge triggered flip-flops 520 are a second stage of the flip-flops. The first stage (e.g., the positive edge triggered flip-flops 510) stabilizes data by latching the data and passing it on to the next stage to be interpreted by rest of the circuit, e.g., the clock multiplexer circuitry 500.

Figure 6:
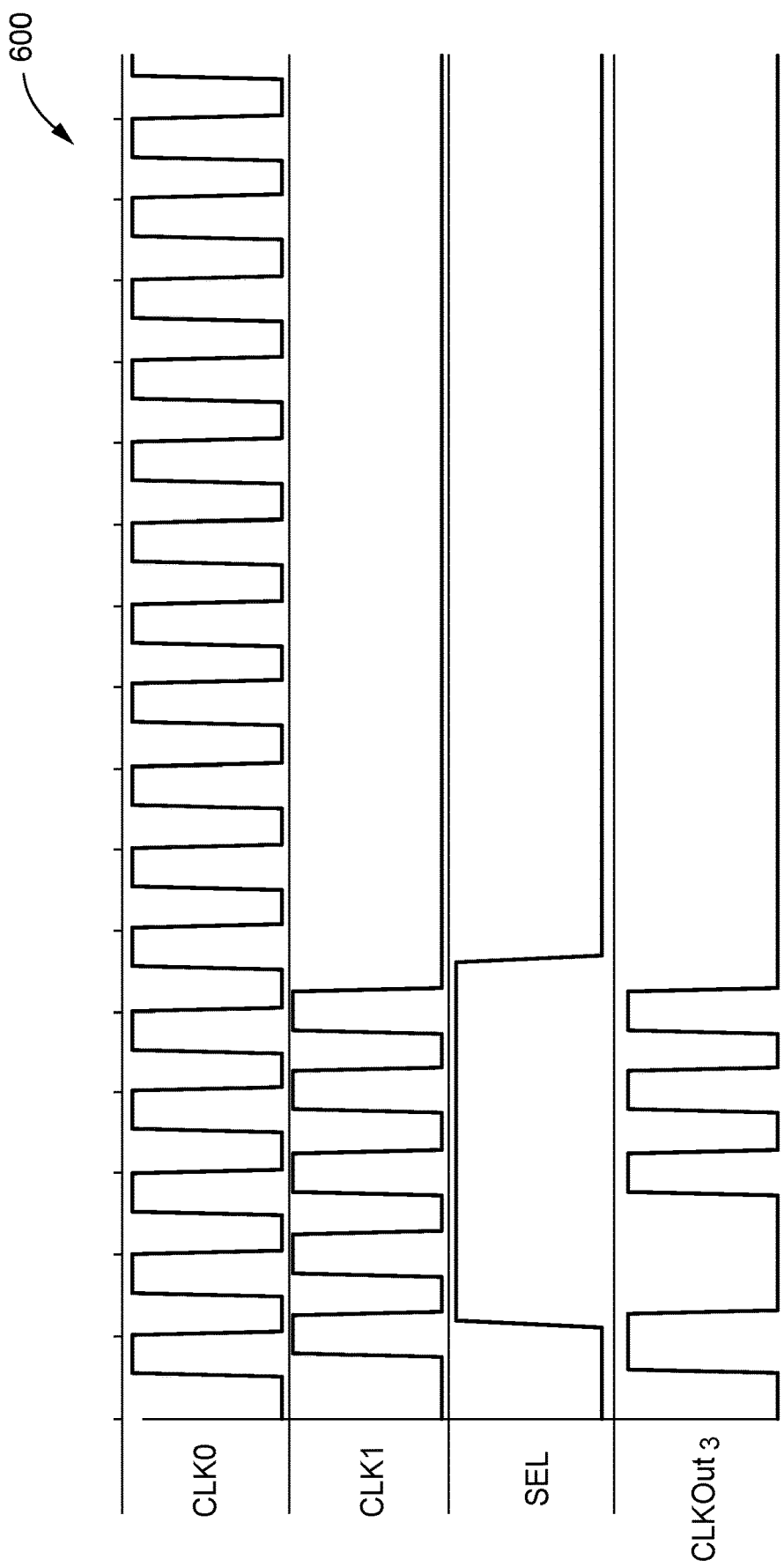
FIG. 6 illustrates example signals of the clock multiplexer circuitry shown in FIG. 5.

In the clock multiplexer circuitry 300 and the clock multiplexer circuitry 500, when switching between the clock signals CLK0 and CLK1, the clock signals CLK0 and CLK1 are active before a first one of clock signals can be deactivated and a second one of the clock signals is activated. However, if a currently selected clock signal is de-activated before switching between clock signals is performed, the output clock signal CLKOut$_3$ does not reflect the newly selected clock signal, as the currently selected clock signal is not active and does not switch on the output of the flip-flop. For example, in FIG. 5, the signals en_clk0 or en_clk1 are not switched. Accordingly, there is no change on select signals sel_clk1 or sel_clk0, and the selected clock signal is not propagated to the output as the output clock signal CLKOut$_3$ and the multiplexing function ceased. FIG. 6 illustrates a graph 600 where the multiplexing function is ceased and no signal is output. As can be seen in FIG. 6, the output clock signal CLKOut$_3$ signal has a low voltage value, and maintains a low voltage value, when the select signal has logic value of 0. Accordingly, no clock signal is output to the corresponding circuit elements when the select signal has a logic value of 0, and the corresponding circuit element may no longer function correctly, and errors can occur within the corresponding electronic device.

Figure 7:
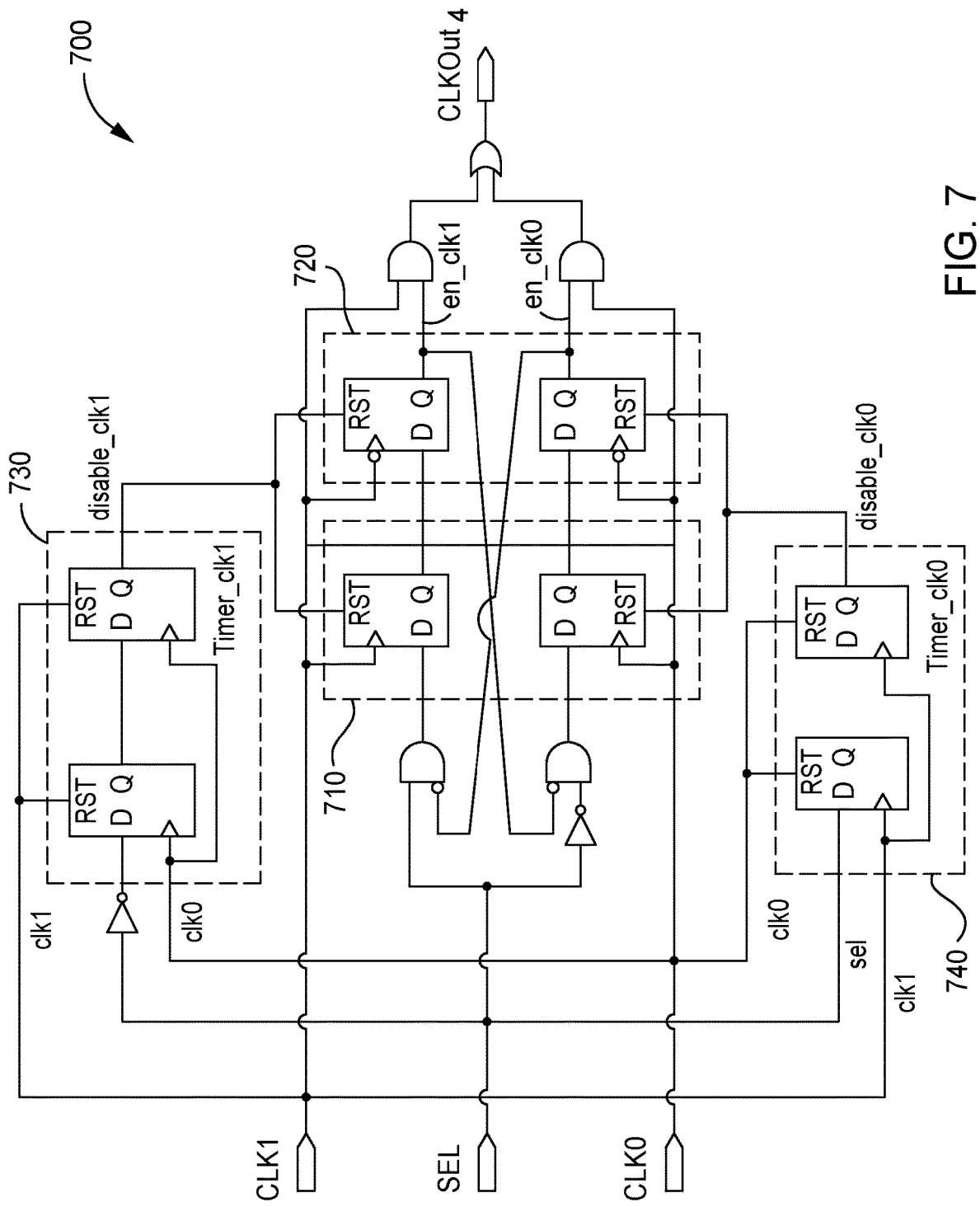
FIG. 7 illustrates a schematic block diagram of another example clock multiplexer circuitry.

FIG. 7 illustrates example clock multiplexer circuitry 700, according to one or more examples. The example clock multiplexer circuitry 700 generates a clock signal (e.g., clock signal CLKOut$_4$) even when a currently selected clock signal (e.g., the clock signal CLK0 or CLK1) is de-activated before switching between clock signals (the clock signals CLK0 and CLK1) is performed. The clock multiplexer circuitry 700 includes positive edge triggered flip-flops 710, negative edge triggered flip-flops 720, timer circuitry 730, and timer circuitry 740. In one example, when both the clock signals CLK0 and CLK1 are active, the timer circuitries 730 and 740 are continuously reset. Accordingly, the output of the timer circuitries 730 and 740 is always a logic value of 0. In an example where the selected clock signal stops, e.g., clock signal CLK0 stops, the selection signal SEL is set to a logic value of 1 to select the clock signal CLK1. As the clock signal CLK0 is not running, the enable signal en_clk0 has a logic value of 0. Further, the input signal Timer_clk0 to the timer circuitry 740 is set to a logic value of 1, and the timer circuitry 740 is activated. After two cycles of the clock signal CLK1, the signal disable_clk0 has a logic value of 1, which resets the corresponding flip-flops of the positive edge triggered flip-flops 710 and negative edge triggered flip-flops 720, and the enable signal en_clk0. Accordingly, the clock signal CLK1 is activated and output as the clock signal CLKOut$_4$.

Figure 8:
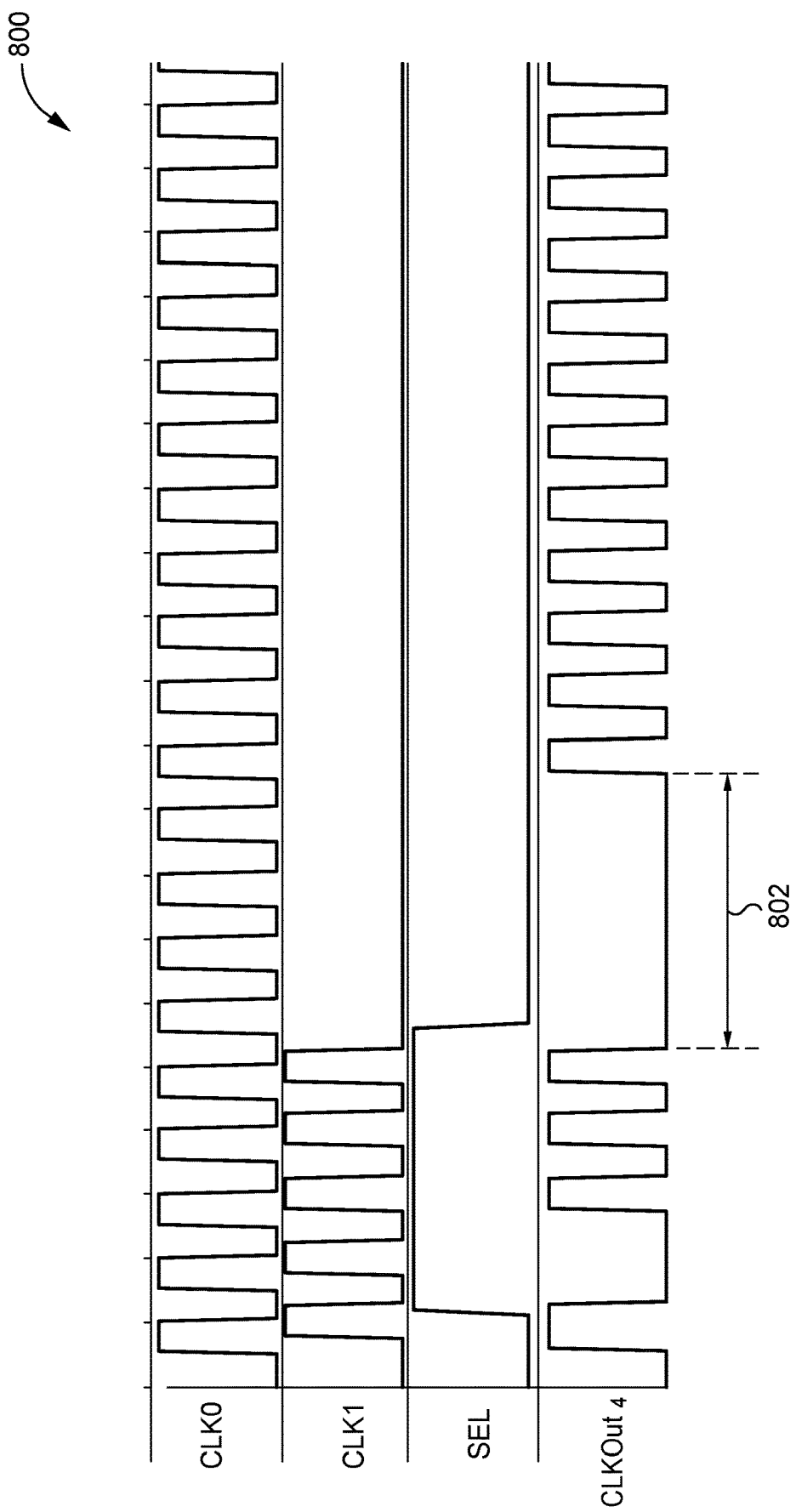
FIG. 8 illustrates example signals of the clock multiplexer circuitry shown in FIG. 7.

However, while the clock multiplexer circuitry 700 is able to generate a clock signal even when a currently selected clock signal is de-activated before switching between clock signals is performed, at least three clock pulses occur before the output signal propagates the selected clock signal as illustrated by waveforms 800 of FIG. 8. As can be seen from the waveforms 800 of FIG. 8, the output clock signals CLKOut$_4$ of the clock multiplexer circuitry 700 has a logic value of 0 for a significant period of time (e.g., period 802), before the selected clock signal is output as the output clock signal CLKOut$_4$. Accordingly, errors within the circuit elements that receive the output clock signal CLKOut$_4$ may not function as expected, and errors may occur within the corresponding electronic systems. Further, the clock multiplexer circuitry 700 includes eight reset-based flip-fops and combinational gates, resulting in a high circuit area (cell) area due to the large number of transistors, increasing the semiconductor device manufacturing cost of the corresponding electron system.

Each of the clock multiplexer circuitries 100, 300, and 500 of FIGS. 1, 3, and 5 respectively, output an output clock signal (e.g., the output clock signals CLKOut$_1$, CLKOut$_2$, and CLKOut$_3$) that includes one or more errors (glitches). Accordingly, the circuit elements driven by the output clock signals output clock signals CLKOut$_1$, CLKOut$_2$, CLKOut$_3$, and CLKOut$_4$ may not function as expected, generating errors within the corresponding electronic systems. Further, in various instances, clock multiplexer circuitries (e.g., the clock multiplexer circuitry 700 of FIG. 7) increases the semiconductor manufacturing costs as the clock multiplexer circuitries increase the circuit area of the corresponding electronic device.

Figure 9:
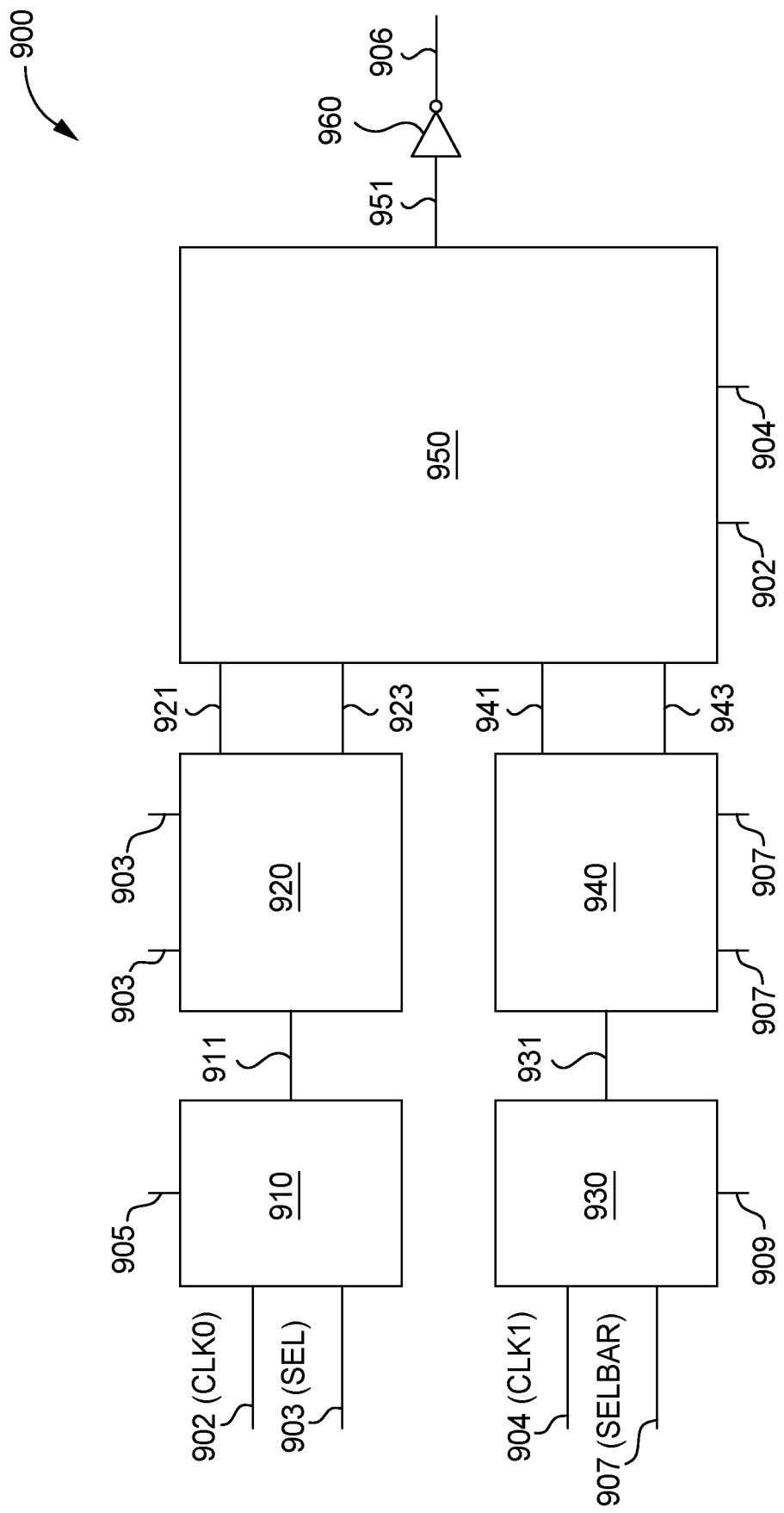
FIG. 9 illustrates a schematic block diagram of the present clock multiplexer circuitry, according to one or more examples.

FIG. 9 illustrates a schematic block diagram of clock multiplexer circuitry 900 that mitigates glitches within the output clock signal. The clock multiplexer circuitry 900 generates an error free output clock signal. The clock multiplexer circuitry 900 mitigates errors that may occur when transitioning between input clock signals, improving the performance of the corresponding electronic device or system.

As illustrated in FIG. 9, the clock multiplexer circuitry 900 includes first selection circuitry 910, first counter circuitry 920, second selection circuitry 930, second counter circuitry 940, and output circuitry 950. The clock multiplexer circuitry 900 receives clock signals 902 (CLK0), 904 (CLK1), and selection signals 903 (SEL), 907 (SELBAR), and outputs the output clock signal 906. The output clock signal 906 is substantially free from errors. For example, the output clock signal 906 may have one or more variations from the clock signals 902, 904, but does not induce errors in the corresponding system (e.g., electronic device) of the clock multiplexer circuitry 900. In one example, the clock multiplexer circuitry 900 includes inverter circuitry that generates the selection signal 907 from the selection signal 903.

The clock signal 906 is the propagated clock signal 902 or propagated clock signal 904. The first selection circuitry 910 receives the clock signal 902, the selection signal 903, and selection control signal 905, and outputs the signal 911. In one example, the first selection circuitry 910 is a multiplexer circuit. In one or more examples, the first selection circuitry 910 is a multiplexer circuitry with an input to output ratio of 2:1. The first selection circuitry 910 selects and outputs the clock signal 902 or the selection control signal 903 as the signal 911 based on the selection control signal 905. For example, based on the selection control signal 905 having a logic value of 1, the first selection circuitry 910 outputs the clock signal 902 as the signal 911. Further, based on the selection control signal 905 having a logic value of zero the first selection circuitry 910 outputs the selection signal 902 as the signal 911.

The first counter circuitry 920 is coupled to the output of the first selection circuitry 910 and receives the signal 911 from the first selection circuitry 910. Further, the first counter circuitry 920 receives the selection signal 903. In one or more examples, the first counter circuitry 920 is a modulus (MOD)-2 asynchronous counter clocked based on the signal 911. As will be described in greater detail in the following, the first counter circuitry 920 outputs the signals 921 and 923 based on the signal 911 and the selection signal 903, and the selection signal 903 resets the state of the flip-flops of the first counter circuitry 920.

The second selection circuitry 930 receives the clock signal 904, the selection signal 907, and selection control signal 909. The second selection circuitry 930 outputs the signal 931. In one example, the second selection circuitry 930 is a multiplexer circuit. The multiplexer circuit may have an input to output ratio of 2:1. The second selection circuitry 930 selects and outputs the clock signal 904 or the selection signal 907 as the signal 931 based on the selection control signal 909. For example, based on the selection control signal 909 having a logic value of 1 the second selection circuitry 930 outputs the clock signal 904 as the signal 931. Further, based on the selection control signal 909 having a logic value of 0 the second selection circuitry 930 outputs the selection signal 907 as the signal 931.

The second counter circuitry 940 is coupled to the output of the second selection circuitry 930. The second counter circuitry 940 receives the signal 931 from the second selection circuitry 930. Further, the second counter circuitry 940 receives the selection signal 907. The second counter circuitry 940 is a MOD-2 asynchronous counter clocked based on the signal 931. As will be described in greater detail in the following, the second counter circuitry 940 outputs the signals 941 and 943 based on the signal 941 and the selection signal 907, and the selection signal 907 resets the state of the flip-flops of the second counter circuitry 940.

The output circuitry 950 receives the signals 921 and 923 from the first counter circuitry 920, and the signals 941 and 943 from the second counter circuitry 940. Further, the output circuitry 950 receives the clock signals 902 and 904. As will be described in greater detail in the following, the output circuitry 950 outputs the clock signal 902 or the clock signal 904 as the output signal 951 based on the signals 921, 923, 941, and 943. The output signal 951 is inverted by inverter circuitry 960 to generate the output clock signal 906.

Figure 10:
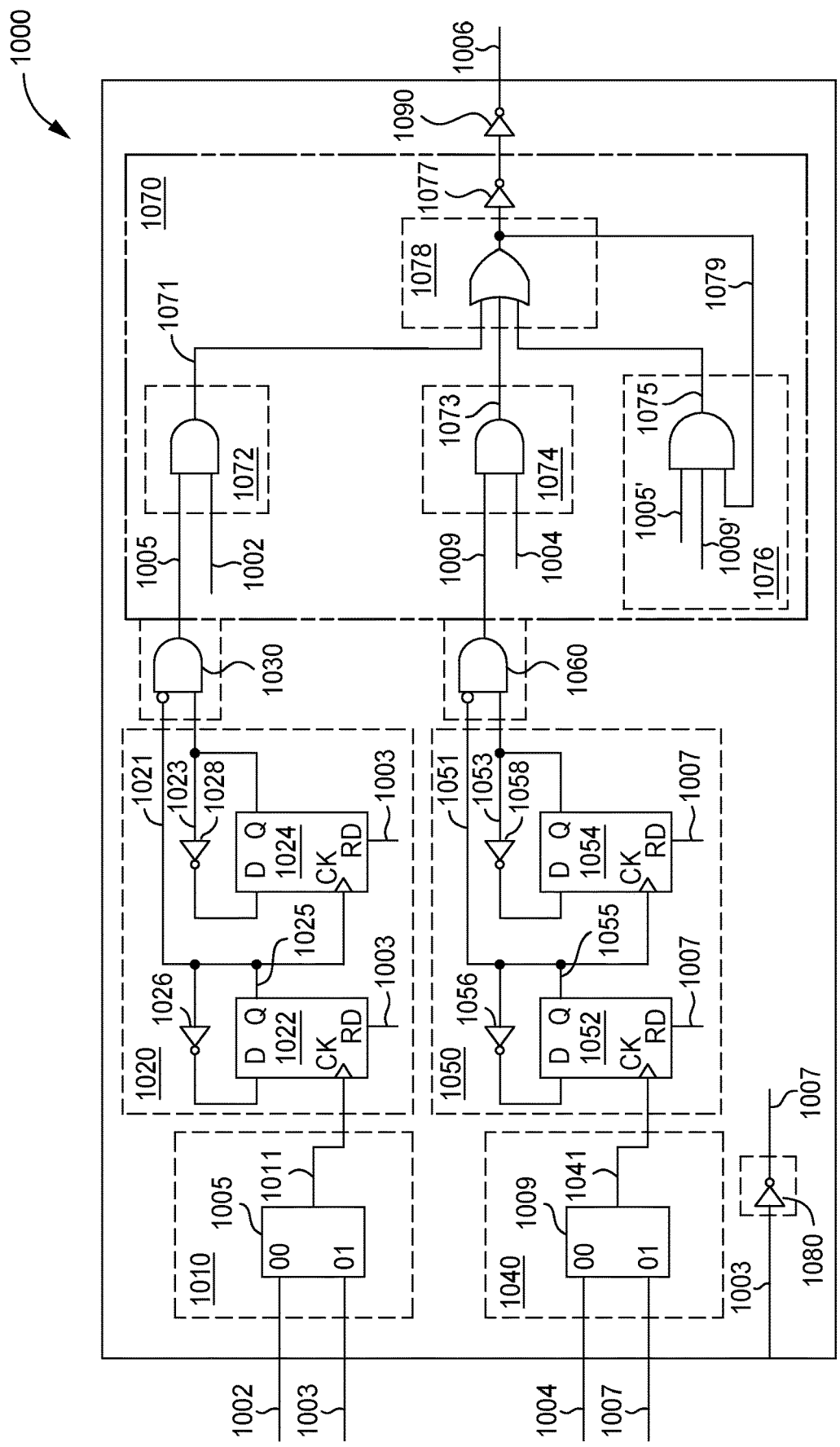
FIG. 10 illustrates another schematic block diagram of the present clock multiplexer circuitry, according to one or more examples.

FIG. 10 illustrates a schematic block diagram of clock multiplexer circuitry 1000, according to one or more examples. The clock multiplexer circuitry 1000 mitigates glitches within the output clock signal (e.g., the output clock signal 1006). The clock multiplexer circuitry 1000 includes first selection circuitry 1010, first counter circuitry 1020, second selection circuitry 1040, second counter circuitry 1050, and output circuitry 1070. In one example, the counter circuitries 1020 and 1050 are each MOD-2 asynchronous counters, and the selection circuitries 1010 and 1040 are 2:1 multiplexers. The clock multiplexer circuitry 1000 further includes AND gate 1030, and AND gate 1060. In one example, the AND gate 1030 and the AND gate 1060 are included within the output circuitry 1070.

The clock multiplexer circuitry 1000 receives the clock signal 1002 (CLK0) and clock signal 1004 (CLK1), and outputs clock signal 1006. The clock signal 1006 is the propagated clock signal 1002 or the propagated clock signal 1004.

The first selection circuitry 1010 receives the clock signal 1002, the selection signal 1003 (SEL), and the first selection control signal 1005. The first selection circuitry 1010 outputs the signal 1011. In one example, the first selection circuitry 1010 is a multiplexer with an input to output ratio of 2:1. The first selection circuitry 1010 selects and outputs the clock signal 1002 or the selection signal 1003 as the signal 1011 based on the logic value of the first selection control signal 1005.

The first counter circuitry 1020 is coupled to the output of the first selection circuitry 1010 and receives the signal 1011 and the selection signal 1003. The first counter circuitry 1020 is a MOD-2 asynchronous counter clocked based on the signal 1011. The first counter circuitry 1020 outputs the signals 1021 and 1023 based on the signal 1011 and the selection signal 1003.

The first counter circuitry 1020 includes flip-flop 1022 and flip-flop 1024, inverter 1026, and inverter 1028. The clock input of the flip-flop 1022 receives the signal 1011 and the data input of the flip-flop 1022 receives an inverted version of the signal 1025 output by the flip-flop 1022. The selection signal 1003 resets the state of the flip-flop 1022. The inverter 1026 inverts the signal 1025. The clock input of the flip-flop 1024 receives the signal 1025 and the data input of the flip-flop 1024 receives an inverted version of the signal 1023 output by the flip-flop 1024. The selection signal 1003 resets the state of the flip-flop 1024. The clock input of the flip-flop 1024 receives the signal 1025 and the data input of the flip-flop 1024 receives an inverted version of the signal 1023. The inverter 1028 inverts the signal 1023. In one example, the value of the signal 1025 output by the flip-flop 1022 is based on a least significant bit (LSB) of the first counter circuitry 1020. Further, the value of the signal 1023 output by the flip-flop 1024 is based on a most significant bit (MSB) of the first counter circuitry 1020.

The AND gate 1030 receives the signal 1021 and the signal 1023 and outputs the first selection control signal 1005. The signal 1021 is inverted before it is received by the AND gate 1030. The AND gate 1030 outputs the first selection control signal 1005 based on the inverted signal 1021 and the signal 1023. While not shown, the first selection control signal 1005 is output to the first selection circuitry 1010 and used to control the selection process performed by the first selection circuitry 1010.

The second selection circuitry 1040 receives the clock signal 1004, the selection signal 1007, and the second selection control signal 1009. The second selection circuitry 1040 outputs the signal 1041 based on the second selection control signal 1009. The second selection circuitry 1040 selects and outputs the clock signal 1004 or the selection signal 1007 as the signal 1041 based on the second selection control signal 1009. In one example, the second selection circuitry 1040 is a multiplexer having an input to output ratio of 2:1.

The second counter circuitry 1050 is coupled to the output of the second selection circuitry 1040. The second counter circuitry 1050 receives the signal 1041 and the selection signal 1007. The second counter circuitry 1050 is a MOD-2 asynchronous counter clocked based on the signal 1041. The second counter circuitry 1050 outputs the signals 1051 and 1053 based on the signal 1041 and the selection signal 1007.

The second counter circuitry 1050 includes flip-flop 1052 and flip-flop 1054, inverter 1056, and inverter 1058. The clock input of the flip-flop 1052 receives the signal 1041 and the data input of the flip-flop 1052 receives an inverted version of the signal 1055 output by the flip-flop 1052. The selection signal 1007 resets the state of the flip-flop 1052. The inverter 1056 inverts the signal 1055. The clock input of the flip-flop 1054 receives the signal 1055 and the data input of the flip-flop 1054 receives an inverted version of the signal 1053 output by the flip-flop 1054. The selection signal 1007 resets the state of the flip-flop 1054. The clock input of the flip-flop 1054 receives the signal 1055 and the data input of the flip-flop 1054 receives an inverted version of the signal 1053. The inverter 1058 inverts the signal 1053. In one example, the value of the signal 1055 output by the flip-flop 1052 is based on a LSB of the second counter circuitry 1050. Further, the value of the signal 1053 output by the flip-flop 1054 is based on a MSB of the second counter circuitry 1050.

The AND gate 1060 receives the signal 1051 and the signal 1053 and outputs the second selection control signal 1009. The signal 1051 is inverted before it is received by the AND gate 1060. The AND gate 1060 outputs the second selection control signal 1009 based on the inverted signal 1051 and the signal 1053. While not shown, the selection control signal 105 is output to the second selection circuitry 1040 and used to control the selection process performed by the second selection circuitry 1040.

The output circuitry 1070 receives the first selection control signal 1005 from the AND gate 1030 and the second selection control signal 1009 from the AND gate 1060 and outputs the clock signal 1006. The clock signal 1006 is the propagated clock signal 1002 or the propagated clock signal 1004.

The output circuitry 1070 includes AND gate 1072, AND gate 1074, AND gate 1076, and OR gate 1078. Further, the output circuitry 1070 includes inverter 1077. The AND gate 1072 receives the first selection control signal 1005 and the clock signal 1002 and outputs the signal 1071 based on the first selection control signal 1005 and the clock signal 1002. In one or more examples, the output circuitry further includes the AND gate 1030 and the AND gate 1060.

The AND gate 1074 receives the second selection control signal 1009 and the clock signal 1004 and outputs the signal 1073 based on the second selection control signal 1009 and the clock signal 1004.

The AND gate 1076 receives an inverted first selection control signal 1005', inverted selection control signal 1009', and signal 1079 output from the OR gate 1078. The first selection control signal 1005 is inverted to generate the inverted first selection control signal 1005'. The second selection control signal 1009 is inverted to generate the inverted second selection control signal 1009'. The AND gate 1076 outputs the signal 1075 based on the inverted first selection control signal 1005', the inverted second selection control signal 1009', and the signal 1079.

The OR gate 1078 receives the signals 1071, 1073, and 1075 and outputs the signal 1079. The signal 1079 is inverted by the inverted 1077 and the inverter 1090 to generate the clock signal 1006.

In one example, the selection signal 1007 deactivates the inactive clock signal, e.g., the clock signal 1004, by resetting the second counter circuitry 1050 in the inactive clock path. In another example, selection signal 1003 deactivates the inactive clock signal, the clock signal 1002, by resetting the first counter circuitry 1020 in the inactive clock path. A clock path includes a multiplexer circuit (e.g., the first selection circuitry 1010 or the second selection circuitry 1040), counter circuitry (e.g., the first counter circuitry 1020 or the second counter circuitry 1050), and an AND gate (e.g., the AND gate 1030 or 1060). The first counter circuitry 1020 or the second counter circuitry 1050 in the active clock path is clocked with the active clock signal until two negative edges of the active clock signal (e.g., the clock signal 1002 or the clock signal 1004) occur. The previously output clock signal 1006 is output during the transition of selection signal 1003. After two negative edges of the active clock signal (e.g., the clock signal 1002 or the clock signal 1004), the output clock signal 1006 is changed to the active clock signal.

In one example, when the selection signal 1003 transitions from a logic value of 0 to a logic value of 1, the first counter circuitry 1020 is reset to value of zero via the asynchronous inputs of the flip-flops 1022 and 1024. Accordingly, the first selection control signal 1005 is set to a logic value of 0 and the value of the signal 1071 output by the AND gate 1072 is a value of zero. In such an example, the second counter circuitry 1050 is active and has an initial state of '00'. State '00' is a logic value of 0, and the state '01' is a logic value of 1. The initial state of the second counter circuitry 1050 is reset by the selection signal 1007 via the asynchronous input of the flip-flops 1052 and 1054 based on the selection signal 1007 having a logic value of 0. After the transition of selection signal 1003, both of the first counter circuitry 1020 and the second counter circuitry 1050 are set to logic '00'. Accordingly, the inverted selection signals 1005' and 1009' are set to a logic value of 1, enabling the AND gate 1076. The AND gate 1076 latches the output signal 1079. As the second counter circuitry 1050 is clocked by the clock signal 1004, until a second negative edge of the clock signal 1004, the AND gate 1076 is enabled. Accordingly, the output signal 1079 remains the same as output before the transition of the selection signal 1003). After the second negative edge of the clock signal 1004), the second counter circuitry 1050 has a count value '10' (a count value of 2). Accordingly, the inverted second selection control signal 1009' is a logic value of 1, and the signal 1075 has as logic value of 0. Further, the AND gate 1074 is enabled and provides clock signal 1004 as the signal 1073. The clock signal 1004 is output until the selection signal has a logic value of 1.

In another example, when the count value of the second counter circuitry 1050 is less than 10 (a count value of 2), and the clock signal 1004 is the active output clock signal (e.g., the clock signal output by the clock multiplexer circuitry 1000), the second selection circuitry 1040 outputs the clock signal 1004 as the signal 1041. Accordingly, the second counter circuitry 1050 increments the count value based on the edges (e.g., the negative edge) of the clock signal 1004. Based on the count value of the second counter circuitry 1050 being '10', the second selection circuitry 1040 outputs the selection signal 1007, maintaining the count value of the second counter circuitry 1050 at '10', and the clock signal 1004 is passed to the output signal 1006 as the output clock signal.

When the selection signal 1003 transitions from a high logic level to a low logic level, the second counter circuitry 1050 is reset to a logic value of 0 by the asynchronous input of the flip-flops 1052 and 1054. Accordingly, the inverted second selection control signal 1009' is logic value of 1 and the output of the AND gate 1074 is logic value of 0. Further, the first counter circuitry 1020 is active with an initial state of '00'. The initial state of the first counter circuitry 1020 is reset when the selection signal 1003 has a value of logic 1. After the transition of the selection signal 1003, the first counter circuitry 1020 and the second counter circuitry 1050 are set to logic '00'. Accordingly, the inverted selection signals 1005' and 1009' are set to a logic value of 1, enabling the AND gate 1076. The enabled AND gate 1076 latches the output signal 1079. As the first counter circuitry 1020 is clocked by the clock signal 1002, the AND gate 1076 is enabled and the output signal 1079 remains unchanged until the second negative edge of the clock signal 1002. After the second negative edge the clock signal 1002, the first counter circuitry 1020 has a counter value of '10'. Accordingly, the inverted first selection control signal 1005' has a logic value of 1, and the signal 1075 of the AND gate 1075 has a logic value of 0. Further, the AND gate 1072 is enabled and the signal 1071 is the clock signal 1002. The AND gate 1072 outputs the signal 1071 until the selection signal 1003 has a logic value of 0.

In one example, when the count value of the first counter circuitry 1020 is less than '10' (logic state of 2), and the clock signal 1002 is the active clock signal (e.g., the clock signal output by the clock multiplexer circuitry 1000), the first selection circuitry 1010 outputs the clock signal 1002 as the signal 1011. Accordingly, the first counter circuitry 1020 increments the count value based on the edges (e.g., the negative edge) of the clock signal 1002. Based on the count value of the first counter circuitry 1020 having a value of '10', the first selection circuitry 1010 outputs the selection signal 1003, maintaining the count value of the first counter circuitry 1020 at '10', and the clock signal 1002 is passed to output signal 1006 as the output clock signal.

Figure 11:
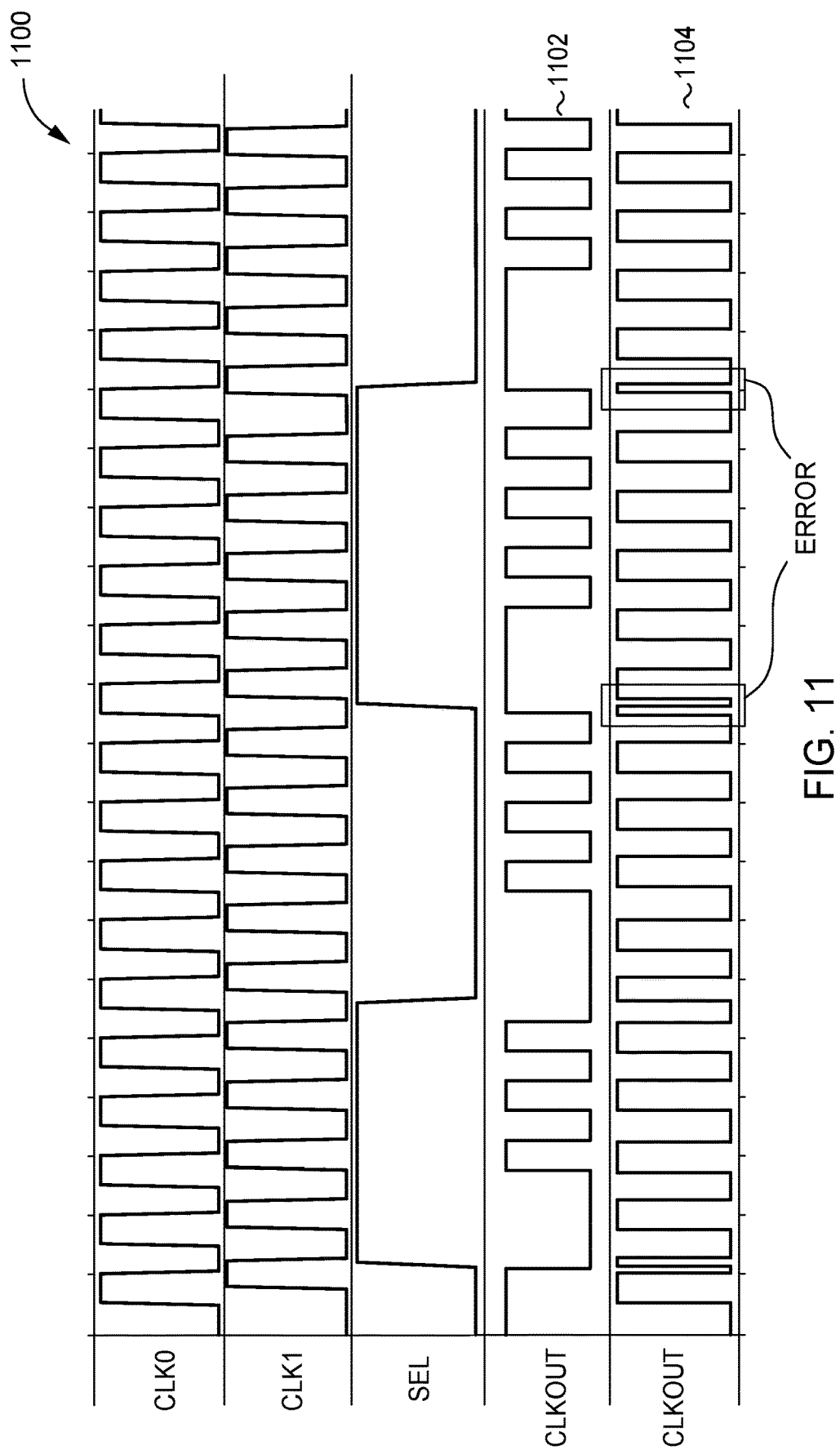
FIG. 11 illustrates example signals of example clock multiplexer circuitries, according to one or more examples.

FIG. 11 shows waveforms 1100 that illustrate a comparison of clock signals experiencing an error and clock signals substantially free from errors. As is illustrated in FIG. 11, the clock signal 1102 is substantially or essentially free from errors (e.g., glitches) and the clock signal 1104 includes multiple errors (e.g., glitches). For example, the clock signal 1102 does not induce errors in the circuit elements that receive the clock signal 1102. The clock signal 1104 includes a pulse with a narrow pulse width as compared to the other pulse widths. The narrow pulse width pulses fail to satisfy a minimum pulse width requirement of sequential circuit elements, which may introduce in errors within the corresponding circuit elements.

Figure 12:
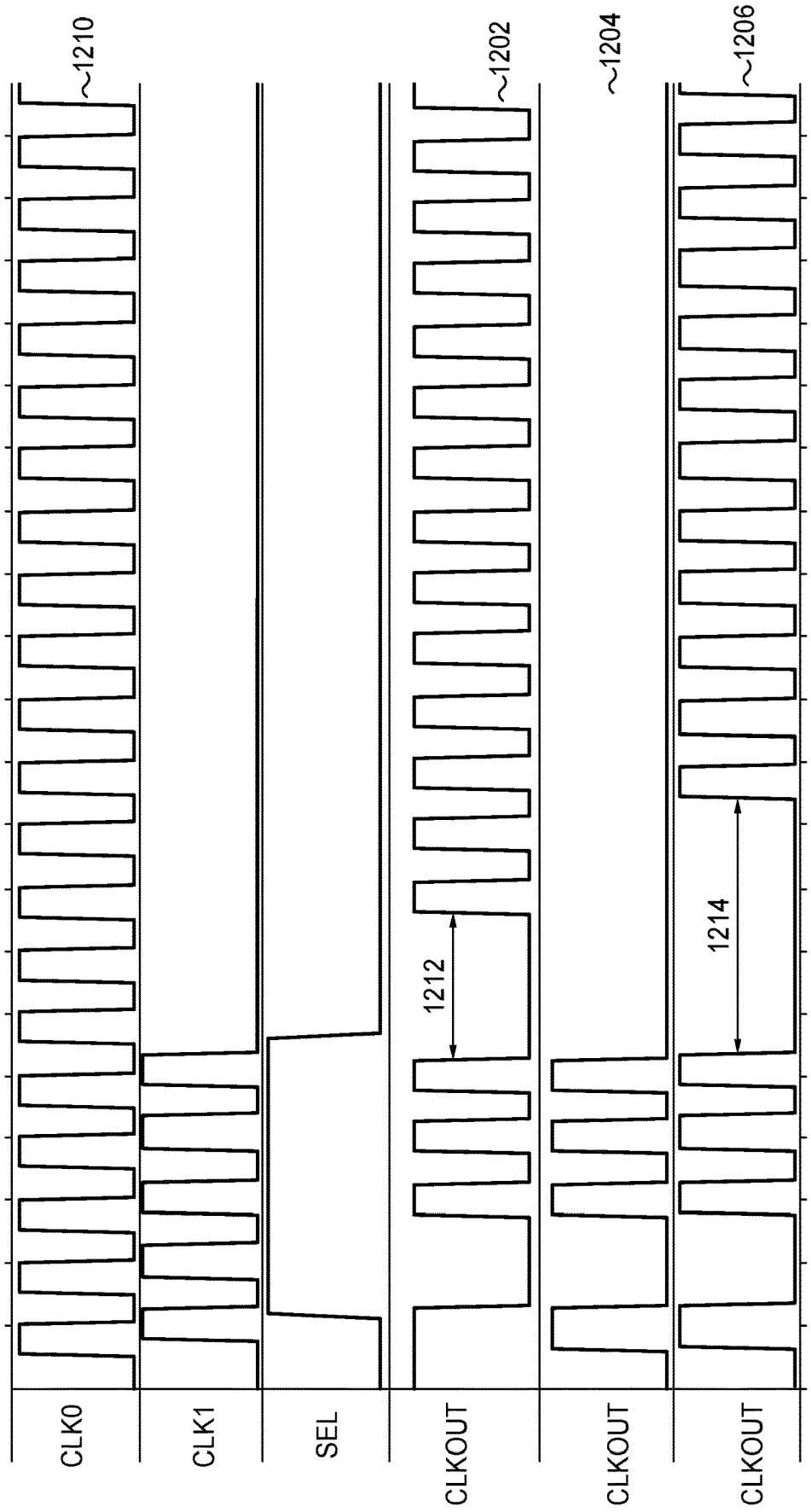
FIG. 12 illustrates example signals of example clock multiplexer circuitries, according to one or more examples.

FIG. 12 illustrates a clock signal in various states. In one example, there is a non-continuous inactive clock signal. In such an example, when the selection signal is transitioned to select the active clock signal then, as illustrated by clock signal 1204, there is a delay until an inactive clock signal pulse to provide a signal to activate the transmission of a select signal to pass the active clock signal to the output of the clock multiplexer circuitry. However, as is illustrated by the clock signal 1204 of FIG. 12, the inactive clock signal may become fixed and the active clock signal is not pass to the output of the clock multiplexer circuitry and the output remains at the previous logic.

A timer-based approach is used to generate the clock signal 1206 as is illustrated by FIG. 7. In generating the clock signal 1206, even if an inactive clock signal becomes stuck, the clock signal switches to an active state after a period. In the clock signal 1202, transmission of the active clock signal does not depend on an inactive state, and, accordingly, the clock signal 1202 becomes active in a shorter amount of time as compared to the clock signal 1206. In one example, the clock signal 1202 is active after the clock signal 1210. In one example, the clock signal 1202 is generated by the clock multiplexer circuitry 900 of FIG. 9 and the clock multiplexer circuitry 1000 of FIG. 10. As can be seen the clock signal 1202 tracks the selected clock signal 1210, and the delay period 1212 is less than the delay period 1214 of the clock signal 1206.

Figure 13:
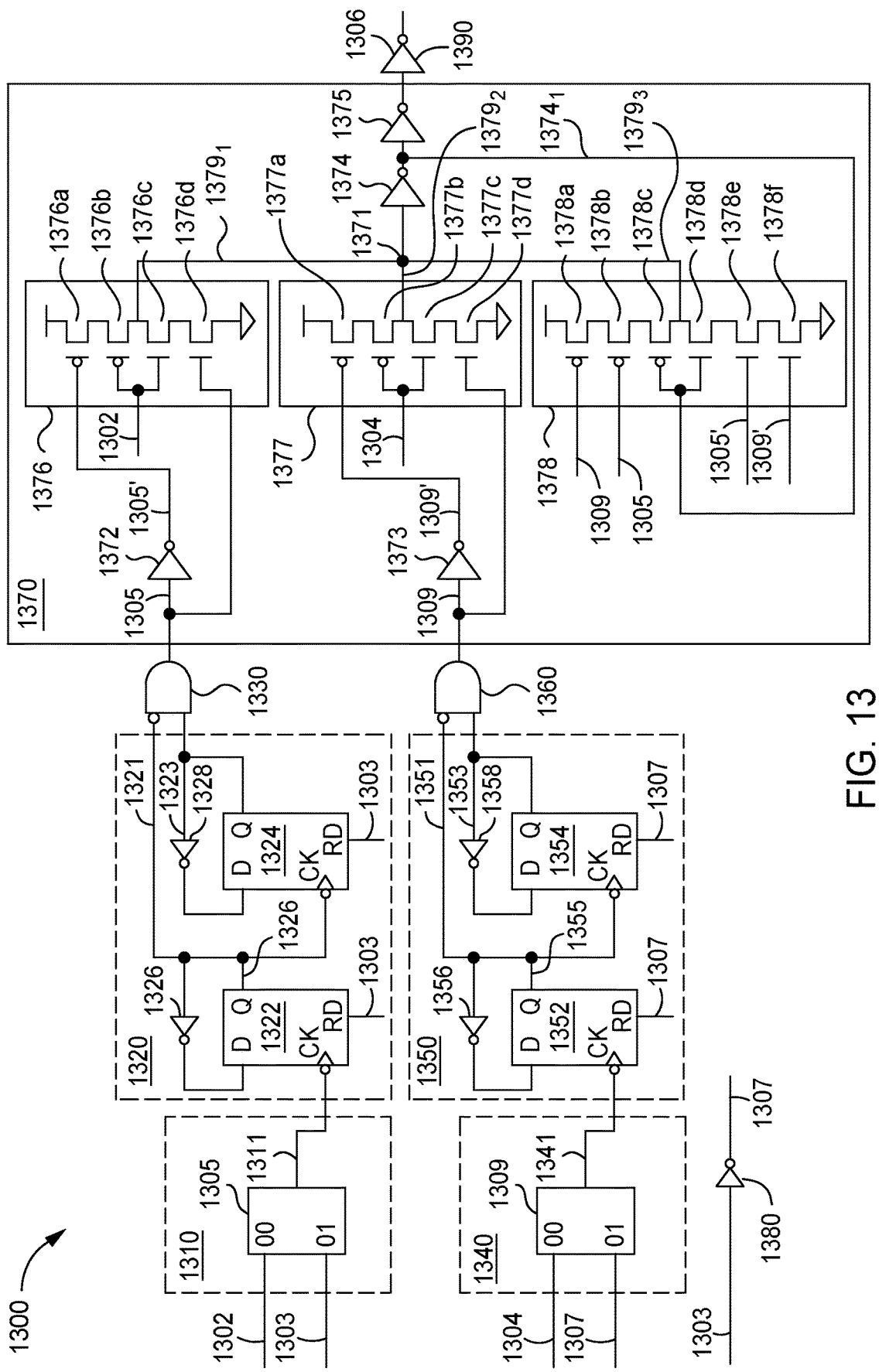
FIG. 13 illustrates another schematic block diagram of the present clock multiplexer circuitry, according to one or more examples.

FIG. 13 illustrates a schematic block diagram of clock multiplexer circuitry 1300, according to one or more examples. The clock multiplexer circuitry 1300 mitigates glitches within the output clock signal (e.g., the output clock signal 1306). The clock multiplexer circuitry 1300 includes first selection circuitry 1310, first counter circuitry 1320, second selection circuitry 1340, second counter circuitry 1350, and output circuitry 1370. In one example, the counter circuitries 1320 and 1350 are each MOD-2 asynchronous counters, and the selection circuitries 1310 are 2:1 multiplexers.

The clock multiplexer circuitry 1300 receives the clock signal 1302 (CLK0) and clock signal 1304 (CLK1), and outputs clock signal 1306. The clock signal 1306 is the propagated clock signal 1302 or the propagated clock signal 1304.

The first selection circuitry 1310 receives the clock signal 1302, the first selection signal 1303 (SEL), and first selection control signal 1305. The first selection circuitry 1310 outputs the signal 1311. In one example, the first selection circuitry 1310 is a multiplexer with an input to output ratio of 2:1. The first selection circuitry 1310 selects and outputs the clock signal 1302 or the first selection signal 1303 as the signal 1311 based on the value of the first selection control signal 1305.

The first counter circuitry 1320 is coupled to the output of the first selection circuitry 1310 and receives the signal 1311 and the first selection signal 1303. The first counter circuitry 1320 is a MOD-2 asynchronous counter clocked based on the signal 1311. The first counter circuitry 1320 outputs the signals 1321 and 1323 based on the signal 1311 and the first selection signal 1303.

The first counter circuitry 1320 includes flip-flop 1322 and flip-flop 1324, inverter 1326, and inverter 1328. The clock input of the flip-flop 1322 receives the signal 1311 and the data input of the flip-flop 1322 receives an inverted version of the signal 1325 output by the flip-flop 1322. The first selection signal 1303 resets the state of the flip-flop 1322. The inverter 1326 inverts the signal 1325. The clock input of the flip-flop 1324 receives the signal 1325 and the data input of the flip-flop 1324 receives an inverted version of the signal 1323 output by the flip-flop 1324. The first selection signal 1303 resets the state of the flip-flop 1324. The clock input of the flip-flop 1324 receives the signal 1325 and the data input of the flip-flop 1324 receives an inverted version of the signal 1323. The inverter 1328 inverts the signal 1323. In one example, the value of the signal 1325 output by the flip-flop 1322 is based on a LSB of the first counter circuitry 1320. Further, the value of the signal 1323 output by the flip-flop 1324 is based on a MSB of the first counter circuitry 1320.

The AND gate 1330 receives the signal 1321 and the signal 1323 and outputs the first selection control signal 1305. The signal 1321 is inverted before it is received by the AND gate 1330. The AND gate 1330 outputs the first selection control signal 1305 based on the inverted version of the signal 1321 and the signal 1323. While not shown, the first selection control signal 1305 is output to the first selection circuitry 1310 and used to control the selection process performed by the first selection circuitry 1310.

The second selection circuitry 1340 receives the clock signal 1304, the second selection signal 1307, and the second selection control signal 1309. The second selection circuitry 1340 outputs the signal 1341 based on the second selection control signal 1309. The second selection circuitry 1340 selects and outputs the clock signal 1304 or the second selection signal 1307 as the signal 1341 based on the second selection control signal 1309. In one example, the second selection circuitry 1340 is a multiplexer having an input to output ratio of 2:1.

The second counter circuitry 1350 is coupled to the output of the second selection circuitry 1340. The second counter circuitry 1350 receives the signal 1341 and the second selection signal 1307. The second counter circuitry 1350 is a MOD-2 asynchronous counter clocked based on the signal 1341. The second counter circuitry 1350 outputs the signals 1351 and 1353 based on the signal 1341 and the second selection signal 1307.

The second counter circuitry 1350 includes flip-flop 1352 and flip-flop 1354, inverter 1356, and inverter 1358. The clock input of the flip-flop 1352 receives the signal 1341 and the data input of the flip-flop 1352 receives an inverted version of the signal 1355 output by the flip-flop 1352. The second selection signal 1307 resets the state of the flip-flop 1352. The inverter 1356 inverts the signal 1355. The clock input of the flip-flop 1354 receives the signal 1355 and the data input of the flip-flop 1354 receives an inverted version of the signal 1353 output by the flip-flop 1354. The second selection signal 1307 resets the state of the flip-flop 1354. The clock input of the flip-flop 1354 receives the signal 1355 and the data input of the flip-flop 1354 receives an inverted version of the signal 1353. The inverter 1358 inverts the signal 1353. In one example, the value of the signal 1355 output by the flip-flop 1352 is based on a LSB of the counter circuitry 1350. Further, the value of the signal 1353 output by the flip-flop 1354 is based on a MSB of the counter circuitry 1350.

The AND gate 1360 receives the signal 1351 and the signal 1353 and outputs the second selection control signal 1309. The signal 1351 is inverted before it is received by the AND gate 1360. The AND gate 1360 outputs the second selection control signal 1309 based on the inverted version of the signal 1351 and the signal 1353. While not shown, the second selection control signal 1309 is output to the second selection circuitry 1340 and used to control the selection process performed by the second selection circuitry 1340.

The output circuitry 1370 receives the first selection control signal 1305 from the AND gate 1330 and the second selection control signal 1309 from the AND gate 1360 and outputs the clock signal 1306. The clock signal 1306 is the propagated clock signal 1302 or the propagated clock signal 1304.

The output circuitry 1370 includes inverters 1372, 1373, 1374, and 1375, and tristate circuitry 1376, tristate circuitry 1377, and tristate circuitry 1378. The inverter 1372 receives and inverts the first selection control signal 1305 to generate the inverted first selection control signal 1305'. The inverter 1373 receives and inverts the second selection control signal 1309 to generate the inverted second selection control signal 1309'.

The tristate circuitry 1376 receives the first selection control signal 1305, the first inverted selection control signal 1305', and the clock signal 1302. The output of the tristate circuitry 1376 is connected to the node 1371, and outputs the signal $1379_1$ based on the first selection control signal 1305, the first inverted selection control signal 1305', and the clock signal 1302. The tristate circuitry 1376 includes transistors 1376a-1376d. The transistors 1376a and 1376b are p-channel metal-oxide-semiconductor field-effect (PMOS) transistors, and the transistors 1376c and 1376d are n-channel metal-oxide-semiconductor field-effect (NMOS) transistors. The gate of the transistor 1376a receives the inverted first selection control signal 1305', the gates of the transistors 1376b and 1376c receive the clock signal 1302, and gate of the transistor 1376d receives the first selection control signal 1305.

The tristate circuitry 1377 receives the second selection control signal 1309, the inverted second selection control signal 1309', and the clock signal 1304. The output of the tristate circuitry 1377 is connected to the node 1371, and outputs the signal $1379_2$ based on the second selection control signal 1309, the inverted second selection control signal 1309', and the clock signal 1304. The tristate circuitry 1377 includes transistors 1377a-1377d. The transistors 1377a and 1377b are PMOS transistors, and the transistors 1377c and 1377d are NMOS transistors. The gate of the transistor 1377a receives the inverted second selection control signal 1309', the gates of the transistors 1377b and 1377c receive the clock signal 1304, and gate of the transistor 1377d receives the second selection control signal 1309.

The tristate circuitry 1378 receives the first selection control signal 1305, the inverted first selection control signal 1305', the second selection control signal 1309, the inverted second selection control signal 1309', and the feedback signal $1374_1$ from the output of the inverter 1374. The output of the tristate circuitry 1378 is connected to the node 1371, and the tristate circuitry 1378 outputs the signal $1379_3$ based on the first selection control signal 1305, the first inverted selection control signal 1305', the second selection control signal 1309, the inverted second selection control signal 1309', and the feedback signal $1374_1$. The tristate circuitry 1378 includes transistors 1378a-1378f. The transistors 1378a-1378c are PMOS transistors, and the transistors 1378d-1378f are NMOS transistors. The gate of the transistor 1378a receives the second selection control signal 1309. The gate of the transistor 1378b receives the first selection control signal 1305. The gates of the transistors 1378c and 1378d receives the feedback signal $1374_1$. The gate of the transistor 1378e receives the inverted first selection control signal 1305'. The gate of the transistor 1378f receives the inverted second selection control signal 1309'.

The node 1371 functions a wired-OR gate. In one example, the node 1371 may be replaced by an OR gate. The node 1371 propagates one of the clock signal 1302, the clock signal 1304, and the signal 1374$_1$ based on the signals 1379$_1$, 1379$_2$, and 1379$_3$. The node 1371 is connected to the input of the inverter 1374 that inverts the output of the node 1371. The output of the inverter 1374 is the signal 1374$_1$ which is output the inverter 1375 and the tristate circuitry 1378. The inverter 1375 inverts the signal 1374$_1$.

The output of the inverter 1375 is received by the inverter 1390. The inverter inverts the output of the inverter 1375 to generate the output clock signal 1306.

In one example, the first selection control signal 1305 has a logic value of 0 and the second selection control signal 1309 has a logic value of 1. Accordingly, the inverted first selection control signal 1305' has a logic value of 1 and the inverted logic signal 1309' has a logic value of 0. The transistors 1376a and 1376d of the tristate circuitry 1376 are turned off, and the clock signal 1302 is not output by the tristate circuitry 1376. In such an example, the transistors 1377a and 1377d of the tristate circuitry 1377 are turned on, and the clock signal 1304 is output by the tristate circuitry 1377. Further, in such an example, the transistors 1378a and 1378b, and 1378e and 1378f of the tristate circuitry 1378 are turned off. Accordingly, the tristate circuitry 1378 does not output the signal 1374$_1$. As the tristate circuitry 1377 outputs the clock signal 1304, and the clock signal 1302 and the signal 1374$_1$ are not output, the node 1371 receives the clock signal 1304 as the signal 1379$_2$, and the clock signal 1304 is output as the output clock signal 1306.

In one example, the first selection control signal 1305 has a logic value of 1 and the second selection control signal 1309 has a logic value of 0. Accordingly, the inverted first selection control signal 1305' has a logic value of 0 and the inverted logic signal 1309' has a logic value of 1. The transistors 1376a and 1376d of the tristate circuitry 1376 are turned on, and the clock signal 1302 is output by the tristate circuitry 1376 as the signal 1379$_1$. In such an example, the transistors 1377a and 1377d of the tristate circuitry 1377 are turned off, and the clock signal 1304 is not output by the tristate circuitry 1377. Further, in such an example, the transistors 1378a and 1378b, and 1378e and 1378f of the tristate circuitry 1378 are turned off. Accordingly, the tristate circuitry 1378 does not output the signal 1374$_1$. As the tristate circuitry 1376 outputs the clock signal 1302, and the clock signal 1304 and the signal 1374$_1$ are not output, the node 1371 receives the clock signal 1302 as the signal 1379$_2$, and the clock signal 1302 is output as the output clock signal 1306.

In one example, the first selection control signal 1305 has a logic value of 0 and the second selection control signal 1309 has a logic value of 0. Accordingly, the first inverted selection control signal 1305' has a logic value of one and the inverted logic signal 1309' has a logic value of one. In such an example, the transistors 1376a and 1376d of the tristate circuitry 1376 are turned off, and the clock signal 1302 is not output by the tristate circuitry 1376. Further, in such an example, the transistors 1377a and 1377d of the tristate circuitry 1377 are turned off, and the clock signal 1304 is not output by the tristate circuitry 1377. Further, the transistors 1378a and 1378b, and 1378e and 1378f of the tristate circuitry 1378 are turned on. Accordingly, the tristate circuitry 1378 outputs the signal 1374$_1$ as the signal 1379$_3$. As the tristate circuitry 1378 outputs the signal 1374$_1$, and the clock signals 1302 and 1306 are not output, the node 1371 receives the signal 1374$_1$ as the signal 1379$_3$, and the signal 1374$_1$ is output as the output clock signal 1306.

In one example, the first selection signal 1303 and the second selection signal 1307 deactivate the inactive clock signal by resetting the first counter circuitry 1320 or 1350 in the inactive clock path. A clock path includes a multiplexer circuit (e.g., the first selection circuitry 1310 or the second selection circuitry 1340), counter circuitry (e.g., the first counter circuitry 1320 or second counter circuitry 1350), and tristate circuitry (e.g., the tristate circuitry 1376 or the tristate circuitry 1377). The first or second counter circuitry 1320, 1350 in the active clock path is clocked with the active clock signal until two negative edges of the active clock signal (e.g., the clock signal 1302 or the clock signal 1304) occur. The previously output clock signal 1306 is output during the transition of the first selection signal 1303. After two negative edges of the active clock signal (e.g., the clock signal 1302 or the clock signal 1304), the output clock signal 1306 is changed to the active clock signal.

In one example, when the first selection signal 1303 transitions from a logic value of 0 to a logic value of 1, the first counter circuitry 1320 is reset to value of 0 via the asynchronous inputs of the flip-flops 1322 and 1324. Accordingly, the first selection control signal 1305 is set to a logic value of 0 and the value of the first inverted selection control signal 1305' output by the inverter circuitry 1373 is a logic value of 1. In such an example, the second counter circuitry 1350 is active and has an initial state of '00'. State '00' is a logic value of zero and the state 01 is a logic value of one. The initial state of the second counter circuitry 1350 is reset by the second selection signal 1307 via the asynchronous input of the flip-flops 1352 and 1354 based on the second selection signal 1307 having a logic value of 0. After the transition of the first selection signal 1303, both of the first counter circuitry 1320 and the second counter circuitry 1350 are set to logic '00'. Accordingly, the selection control signals 1305 and 1309 are set to a logic value of 0, enabling the tristate circuitry 1378. The tristate circuitry 1378 latches the output signal 1374$_1$. As the second counter circuitry 1350 is clocked by the clock signal 1304, until a second negative edge of the clock signal 1304, the tristate circuitry 1376 is enabled. Accordingly, the output signal 1374$_1$ remains the same as output before the transition of the first selection signal 1303). After the second negative edge of the clock signal 1304), the second counter circuitry 1350 has a count value '10' (a count value of 2). Accordingly, the second selection control signal 1309 has a logic value of 1. Further, the tristate circuitry outputs the clock signal 1304 as the signal 1379$_2$.

In another example, when the count value of the second counter circuitry 1350 is less than '10' (a count value of 2), and the clock signal 1304 is the active output clock signal (e.g., the clock signal output by the clock multiplexer circuitry 1300), the second selection circuitry 1340 outputs the clock signal 1304 as the signal 1341. Accordingly, the second counter circuitry 1350 increments the count value based on the edges (e.g., the negative edge) of the clock signal 1304. Based on the count value of the second counter circuitry 1350 being '10', the second selection circuitry 1340 outputs the second selection signal 1307, maintaining the count value of the second counter circuitry 1350 at '10', and the clock signal 1304 is passed to the output signal 1306 as the output clock signal.

When the first selection signal 1303 transitions from a logic value of 1 to a logic value of 0, the second counter circuitry 1350 is reset to a logic value of 0 by the asynchronous input of the flip-flops 1352 and 1354. Accordingly, the second selection control signal 1309 has a logic value of 0. Further, the first counter circuitry 1320 is active with an initial state of '00'. The initial state of the first counter circuitry 1320 is reset when the first selection signal 1303 has a logic value of 1. After the transition of the first selection signal 1303, the first counter circuitry 1320 and the second counter circuitry 1350 are set to logic '00'. Accordingly, the first and second selection control signals 1305 and 1309 are set to a logic value of 0, enabling the tristate circuitry 1378. The enabled tristate circuitry 1378 latches the signal $1374_1$. As the first counter circuitry 1320 is clocked by the clock signal 1302, the tristate circuitry 1378 is enabled and the output signal $1374_1$ remains unchanged until the second negative edge of the clock signal 1302. After the second negative edge the clock signal 1302, the first counter circuitry 1320 has a counter value of '10'. Accordingly, the first selection control signal 1305 has a logic value of 1, and the tristate circuitry 1376 outputs the clock signal 1302.

In one example, when the count value of the first counter circuitry 1320 is less than '10' (logic state of 2), and the clock signal 1302 is the active clock signal (e.g., the clock signal output by the clock multiplexer circuitry 1300), the first selection circuitry 1310 outputs the clock signal 1302 as the signal 1311. Accordingly, the first counter circuitry 1320 increments the count value based on the edges (e.g., the negative edge) of the clock signal 1302. Based on the count value of the first counter circuitry 1320 having a value of '10', the first selection circuitry 1310 outputs the first selection signal 1303, maintaining the count value of the first counter circuitry 1320 at '10', and the clock signal 1302 is passed to output signal 1306 as the output clock signal.

In one or more examples, the clock multiplexer circuitry 1300 mitigates errors that may occur when the first selection signal 1303 toggles (e.g., transitions) close to a rising or falling edge of the clock signal 1302 or 1304. For example, the clock multiplexer circuitry 1300 mitigates errors that may occur when the first selection signal 1303 has a falling edge that occurs just after a falling edge the clock signal 1302 or 1304, and/or when the first selection signal 1303 has a falling edge that occurs just after a rising edge the clock signal 1302 or 1304.

Figure 14:
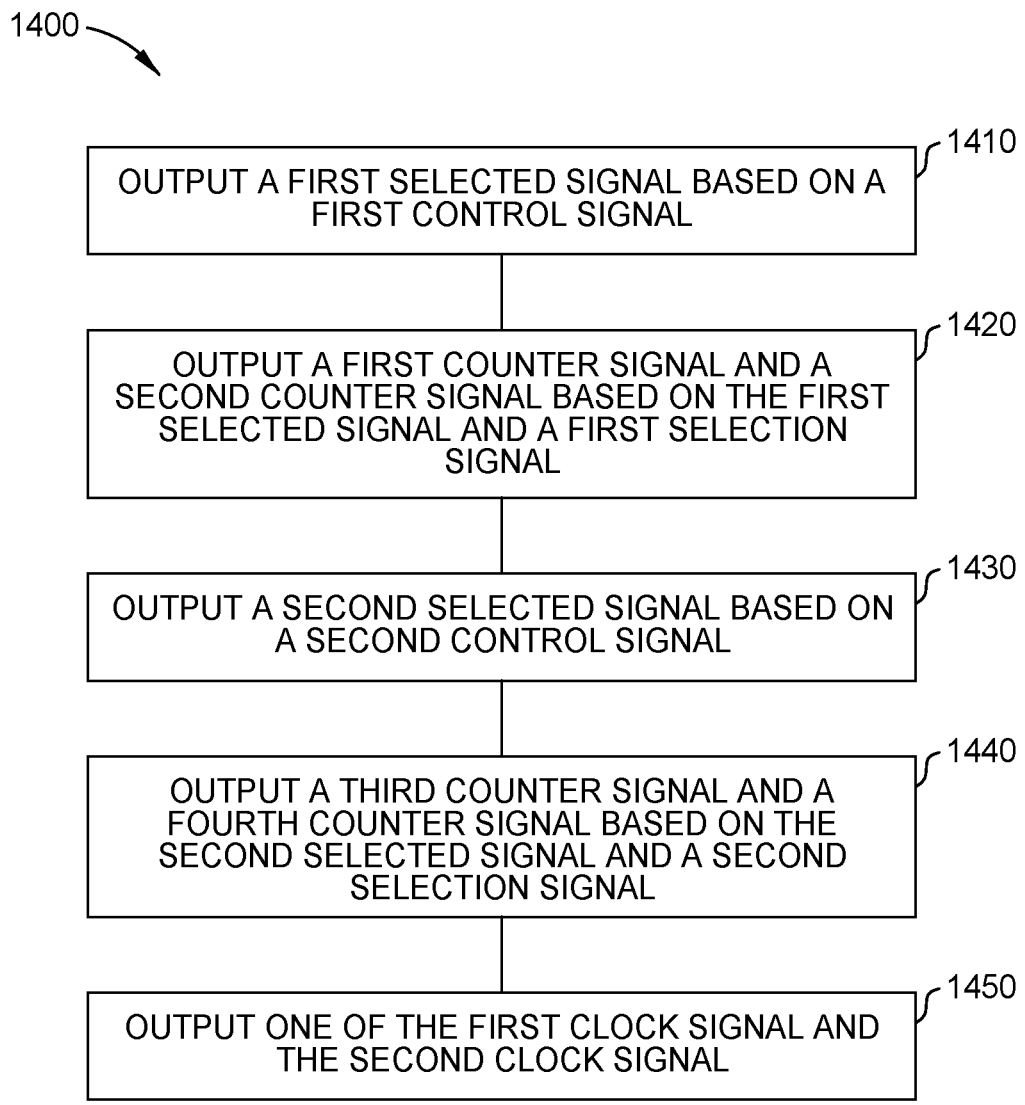
FIG. 14 illustrates a flowchart of a method for operating clock multiplexer circuitry, according to one or more examples.

FIG. 14 illustrates a flowchart of a method 1400 for operating clock multiplexer circuitry, according to one or more examples. At 1410 of the method 1400, a first selected signal is output based on a first control signal. For example, with reference to the clock multiplexer circuitry 900 of FIG. 9, the first selection circuitry 910 receives the clock signal 902, the first selection signal 903, and the first selection control signal 905, and outputs the signal 911 based on the first selection control signal 905. The signal 911 is one of the clock signal 902 and the selection signal 903.

At 1420 of the method 1400, a first counter signal and a second counter signal are output based on the first selected signal and a first selection signal. For example, with reference to FIG. 9, the first counter circuitry 920 receives the signal 911 and the selection signal 903. The first counter circuitry 920 outputs the signals (e.g., counter signals) 921 and 923 based on the signal 911 and the first selection signal 903. In one example, the counter signals are signals 1021 and 1023 of FIG. 10, which are generated based on the signal 1011 and selection signal 1003 as described above with regard to FIG. 10. Further, with regard to FIG. 13, the counter signals are signals 1321 and 1323, which are generated based on the signal 1311 and the selection signal 1303.

At 1430 of the method 1400, a second selected signal is output based on a second control signal. For example, with reference to the clock multiplexer circuitry 900 of FIG. 9, the second selection circuitry 930 receives the clock signal 904, the selection signal 907, and the second selection control signal 908, and outputs the signal 931 based on the second selection control signal 908. The signal 931 is one of the clock signal 904 and the selection signal 907.

At 1440 of the method 1400, a third counter signal and fourth counter signal are output based on the second selected signal and a second selection signal. For example, with reference to FIG. 9, the first counter circuitry 940 receives the signal 931 and the selection signal 907. The second counter circuitry 940 outputs the signals (e.g., counter signals) 941 and 943 based on the signal 931 and the selection signal 907. In one example, the counter signals are signals 1051 and 1053 of FIG. 10, which are generated based on the signal 1041 and selection signal 1003 as described above with regard to FIG. 10. Further, with regard to FIG. 13, the counter signals are signals 1351 and 1353, which are generated based on the signal 1341 and the selection signal 1307.

At 1450 of the method 1400, one of the first clock signal and the second clock signal are output. One of the first clock signal and the second clock signal are output based the first counter signal, the second counter signal, the third counter signal, and the fourth counter signal. With regard to FIG. 9, one of the clock signal 902 and the clock signal 904 are output by the clock multiplexer circuitry 900. For example, the output circuitry 950 receives the signals 921, 923, 941 and 943, and clock signals 902 and 904. The output circuitry 950 outputs one of the clock signals 902 and 904 based on the signals 921, 923, 941 and 943. In one example, with regard to FIG. 10, the output circuitry 1070 outputs one of the clock signals 1002 and 1004 based on the signals 1021, 1023, 1051, and 1053 as is described above with regard to FIG. 10. Further, in one example, with regard to FIG. 13, the output circuitry 1370 outputs one of the clock signals 1302 and 1304 based on the signals 1321, 1323, 1351, and 1353 as is described above with regard to FIG. 13.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A clock multiplexer circuitry comprising:
    first selection circuitry connected in series with first counter circuitry, the first selection circuitry and the first counter circuitry configured to receive a first clock signal and a first selection signal, wherein a first control signal is generated based on the first clock signal and the first selection signal;
    second selection circuitry connected in series with second counter circuitry, the second selection circuitry and the second counter circuitry configured to receive a second clock signal and a second selection signal, wherein a second control signal is generated based on the second clock signal and the second selection signal; and
    output circuitry connected to the first counter circuitry and the second counter circuitry, the output circuitry configured to output one of the first clock signal and the second clock signal based on the first control signal and the second control signal.

2. The clock multiplexer circuitry of claim 1, wherein the second selection signal is an inverted version of the first selection signal, and the first counter circuitry is configured to be reset and the second counter circuitry is configured to be active based on the first selection signal having a first value, and the second counter circuitry is configured to be reset and the first counter circuitry is configured to be active based on the first selection signal having a second value different than the first value.

3. The clock multiplexer circuitry of claim 1, wherein:
the first selection circuitry is configured to receive the first clock signal, the first selection signal, and the first control signal, and output a first selected signal based on the first control signal, the first selected signal is one of the first clock signal and the first selection signal; and
the first counter circuitry is connected to an output of the first selection circuitry and configured to receive the first selected signal and the first selection signal, and output a first counter signal and a second counter signal based on the first selected signal and the first selection signal.

4. The clock multiplexer circuitry of claim 3, wherein the first counter circuitry comprises:
a first flip-flop comprising:
a first clock input pin configured to receive the first selected signal from the first selection circuitry;
a first output pin configured to output the first counter signal;
a first reset pin configured to receive the first selection signal; and
a first data input pin configured to receive an inverted version of the first counter signal; and
a second flip-flop comprising:
a second clock input pin configured to receive the first counter signal;
a second output pin configured to output the second counter signal;
a second reset pin configured to receive the first selection signal; and
a second data input pin configured to receive an inverted version of the second counter signal.

5. The clock multiplexer circuitry of claim 3, wherein:
the second selection circuitry is configured to: receive the second clock signal, the second selection signal, and the second control signal; and output a second selected signal based on the second control signal, the second selected signal is one of the second clock signal and the second selection signal; and
the second counter circuitry is connected to an output of the second selection circuitry and configured to: receive the second selected signal and the second selection signal; and output a third counter signal and a fourth counter signal based on the second selected signal and the second selection signal.

6. The clock multiplexer circuitry of claim 5, wherein the second counter circuitry comprises:
a third flip-flop comprising:
a third clock input pin configured to receive the second selected signal from the second selection circuitry;
a third output pin configured to output the third counter signal;
a third reset pin configured to receive the second selection signal; and
a third data input pin configured to receive an inverted version of the third counter signal; and
a fourth flip-flop comprising:
a fourth clock input pin configured to receive the third counter output signal;
a fourth output pin configured to output the fourth counter signal;
a fourth reset pin configured to receive the second selection signal; and
a fourth data input pin configured to receive an inverted version of the fourth counter signal.

7. The clock multiplexer circuitry of claim 5 further comprising:
a first AND gate connected to the output of the first counter circuitry and configured to: receive the first counter signal and the second counter signal; and output the first control signal based on the first counter signal and the second counter signal; and
a second AND gate is connected to the output of the second counter circuitry and configured to: receive the third counter signal and the fourth counter signal; and output the second control signal based on the third counter signal and the fourth counter signal.

8. The clock multiplexer circuitry of claim 7, wherein the output circuitry comprises:
a third AND gate connected to an output the first AND gate, and configured to: receive the first control signal and the first clock signal; and output the first clock signal based on the first control signal and the first clock signal;
a fourth AND gate connected to an output the second AND gate, and configured to: receive the second control signal and the second clock signal; and output the second clock signal based on the second control signal and the second clock signal; and
a fifth AND gate configured to receive an inverted first control signal, an inverted second control signal, and an output signal, and configured to output an AND signal based on the inverted first control signal, the inverted second control signal, and the output signal.

9. The clock multiplexer circuitry of claim 8, wherein the output circuitry further comprises:
an OR gate connected to an output of the third AND gate, the fourth AND gate, and the fifth AND gate, and configured to receive the first clock signal, the second clock signal, and the AND signal, and output the output signal.

10. The clock multiplexer circuitry of claim 7, wherein the output circuitry comprises:
first tristate circuitry configured to receive the first control signal, an inverted first control signal, and the first clock signal, and output the first clock signal based on the first selection signal;
second tristate circuitry configured to receive the second control signal, an inverted second control signal, and the second clock signal, and output the second clock signal based on the second selection signal; and
third tristate circuitry configured to receive the first selection signal, the second selection signal, the inverted first control signal, the inverted second control signal, and an output signal, and output a tristate signal based on the first selection signal and the second selection signal.

11. The clock multiplexer circuitry of claim 10, wherein the output circuitry further comprises an inverter configured to receive one of the first clock signal from the first tristate circuitry, the second clock signal from the second tristate circuitry, and the tristate signal from the third tristate circuitry, and output the output signal.

12. A clock multiplexer circuitry comprising:
first selection circuitry configured to receive a first clock signal, a first selection signal, and a first control signal, and output a first selected signal based on the first control signal, wherein the first selected signal is one of the first clock signal and the first selection signal;
first counter circuitry configured to receive the first selected signal and the first selection signal, and output a first counter signal and a second counter signal based on the first selected signal and the first selection signal;
second selection circuitry configured to receive a second clock signal, a second selection signal, and a second control signal, and output a second selected signal based on the second control signal, wherein the second selected signal is one of the second clock signal and the second selection signal;
second counter circuitry configured to receive the second selected signal and the second selection signal, and output a third counter signal and a fourth counter signal based on the second selected signal and the second selection signal; and
output circuitry connected to the first counter circuitry and the second counter circuitry and configured to output one of the first clock signal and the second clock signal based on the first counter signal, the second counter signal, the third counter signal, and the fourth counter signal.

13. The clock multiplexer circuitry of claim 12, wherein the second selection signal is an inverted version of the first selection signal, and the first counter circuitry is configured to be reset and the second counter circuitry is configured to be active based on the first selection signal having a first value, and the second counter circuitry is configured to be reset and the first counter circuitry is configured to be active based on the first selection signal having a second value different than the first value.

14. The clock multiplexer circuitry of claim 12 further comprising:
a first AND gate connected to the output of the first counter circuitry and configured to receive the first counter signal and the second counter signal, and output the first control signal based on the first counter signal and the second counter signal; and
a second AND gate is connected to the output of the second counter circuitry and configured to receive the third counter signal and the fourth counter signal, and output the second control signal based on the third counter signal and the fourth counter signal.

15. The clock multiplexer circuitry of claim 14, wherein the output circuitry comprises:
a third AND gate connected to an output the first AND gate, and configured to receive the first control signal and the first clock signal, and output the first clock signal based on the first control signal and the first clock signal;
a fourth AND gate connected to an output the second AND gate, and configured to receive the second control signal and the second clock signal, and output the second clock signal based on the second control signal and the second clock signal;
a fifth AND gate configured to receive an inverted first control signal, an inverted second control signal, and an output signal, and configured to output a AND signal based on the inverted first control signal, the inverted second control signal, and the output signal; and an OR gate connected to an output of the third AND gate, the fourth AND gate, and the fifth AND gate, and configured to receive the first clock signal, the second clock signal, and the AND signal, and output the output signal, the output signal is one of the first clock signal, the second clock signal, and the AND signal.

16. The clock multiplexer circuitry of claim 14, wherein the output circuitry comprises:
first tristate circuitry configured to receive the first control signal, an inverted first control signal, and the first clock signal, and output the first clock signal based on the first control signal;
second tristate circuitry configured to receive the second control signal, an inverted second control signal, and the second clock signal, and output the second clock signal based on the second control signal;
third tristate circuitry configured to receive the first control signal, the second control signal, the inverted first control signal, the inverted second control signal, and an output signal, and output a tristate signal based on the first control signal and the second control signal; and
an inverter configured to receive one of the first clock signal from the first tristate circuitry, the second clock signal from the second tristate circuitry, and the tristate signal from the third tristate circuitry, and output the output signal.

17. The clock multiplexer circuitry of claim 12, wherein:
the first counter circuitry comprises a first flip-flop configured to output the first counter signal based on the first selected signal and the first selection signal, and a second flip-flop configured to output the second counter signal based on the first counter signal and the first selection signal; and
the second counter circuitry comprising a third flip-flop configured to output the third counter signal based on the second selected signal and the second selection signal, and a fourth flip-flop configured to output the fourth counter signal based on the third counter signal and the second selection signal.

18. A method comprising:
outputting, via first selection circuitry of clock multiplexer circuitry, a first selected signal based on a first control signal, wherein the first selected signal is one of a first clock signal and a first selection signal;
outputting, via first counter circuitry of the clock multiplexer circuitry, a first counter signal based on the first selected signal and the first selection signal, and a second counter signal based on the first counter signal and the first selection signal;
outputting, via second selection circuitry of the clock multiplexer circuitry, a second selected signal based on a second control signal, wherein the first selected signal is one of a second clock signal and a second selection signal;
outputting, via second counter circuitry of the clock multiplexer circuitry, a third counter signal based on the second selected signal and the second selection signal, and a fourth counter signal based on the third counter signal and the second selection signal; and
outputting, via output circuitry of the clock multiplexer circuitry, one of the first clock signal and the second clock signal based on the first counter signal, the second counter signal, the third counter signal, and the fourth counter signal.

19. The method of claim 18 further comprising:
outputting, via a first AND gate of the clock multiplexer circuitry, the first control signal based on the first counter signal and the second counter signal;
outputting, via a second AND gate of the clock multiplexer circuitry, the second control signal based on the third counter signal and the fourth counter signal;
outputting, via a third AND gate of the clock multiplexer circuitry, the first clock signal, based on the first control signal and the first clock signal;
outputting, via a fourth AND gate of the clock multiplexer circuitry, the second clock signal based on the second control signal and the second clock signal;
outputting, via a fifth AND gate of the clock multiplexer circuitry, an AND signal based on an inverted first control signal, an inverted second control signal, and an output signal; and
outputting, via an OR gate of the clock multiplexer circuitry, the output signal based on the first clock signal, the second clock signal, and the AND signal.

20. The method of claim 18 further comprising:
outputting, via a first AND gate of the clock multiplexer circuitry, the first control signal based on the first counter signal and the second counter signal; outputting, via a second AND gate of the clock multiplexer circuitry, the second control signal based on the third counter signal and the fourth counter signal;
outputting, via first tristate circuitry of the clock multiplexer circuitry, the first clock signal based on the first control signal;
outputting, via second tristate circuitry of the clock multiplexer circuitry, the second clock signal based on the second control signal;
outputting, via third tristate circuitry of the clock multiplexer circuitry, a tristate signal based on the first control signal and the second control signal; and
outputting, via an inverter of the clock multiplexer circuitry, an output signal based on first clock signal, the second clock signal, and the tristate signal.

* * * * *